United States Patent
Shen

(10) Patent No.: US 8,900,969 B2
(45) Date of Patent: Dec. 2, 2014

(54) METHODS OF STRESS BALANCING IN GALLIUM ARSENIDE WAFER PROCESSING

(75) Inventor: Hong Shen, Oak Park, CA (US)

(73) Assignee: Skyworks Solutions, Inc., Woburn, MA (US)

(*) Notice: Subject to any disclaimer, the term of this patent is extended or adjusted under 35 U.S.C. 154(b) by 137 days.

(21) Appl. No.: 13/360,489

(22) Filed: Jan. 27, 2012

(65) Prior Publication Data

US 2013/0193573 A1    Aug. 1, 2013

(51) Int. Cl.
*H01L 23/48* (2006.01)
*H01L 33/12* (2010.01)

(52) U.S. Cl.
CPC .................................... *H01L 33/12* (2013.01)
USPC ............ 438/457; 257/178; 257/279; 257/669

(58) Field of Classification Search
CPC ....................................................... H01L 33/12
USPC ........................... 257/279, 178, 669; 438/457
See application file for complete search history.

(56) References Cited

U.S. PATENT DOCUMENTS

| | | | |
|---|---|---|---|
| 3,896,479 A * | 7/1975 | Di Lorenzo et al. | 257/473 |
| 5,075,744 A * | 12/1991 | Tsui | 257/190 |
| 6,431,432 B1 | 8/2002 | McCormick et al. | |
| 6,492,269 B1 | 12/2002 | Liu et al. | |
| 6,495,019 B1 | 12/2002 | Filas et al. | |
| 6,596,635 B1 | 7/2003 | Tiku et al. | |
| 6,870,243 B2 | 3/2005 | Elliott et al. | |
| 6,982,441 B2 | 1/2006 | Yamaki et al. | |
| 7,179,738 B2 | 2/2007 | Abbott | |
| 7,402,515 B2 | 7/2008 | Arana et al. | |
| 7,429,529 B2 | 9/2008 | Farnworth et al. | |
| 7,494,925 B2 | 2/2009 | Hiatt | |
| 7,517,798 B2 | 4/2009 | Tuttle | |
| 7,880,307 B2 | 2/2011 | Farnworth et al. | |
| 7,898,064 B2 | 3/2011 | Tuttle | |
| 7,923,842 B2 | 4/2011 | Shen et al. | |
| 8,169,004 B2 * | 5/2012 | Kohiro et al. | 257/194 |
| 8,318,519 B2 * | 11/2012 | Doan et al. | 438/33 |
| 2002/0048889 A1 | 4/2002 | Hayama et al. | |
| 2002/0093101 A1 | 7/2002 | Iyer et al. | |
| 2003/0015721 A1 | 1/2003 | Slater et al. | |
| 2003/0020174 A1 | 1/2003 | Kohno | |
| 2003/0141593 A1 | 7/2003 | Zuniga-Ortiz et al. | |
| 2004/0176053 A1 | 9/2004 | Yamashita | |
| 2005/0085084 A1 | 4/2005 | Chang et al. | |
| 2005/0127480 A1 | 6/2005 | Elliott et al. | |
| 2005/0157476 A1 | 7/2005 | Goudarzi | |

(Continued)

OTHER PUBLICATIONS

Nishizawa, et al; Stress Suppression of Backside Metal in GaAs Devices; CS Mantech Conference Proceedings; p. 271; May 17-20, 2010; Portland, Oregon, USA.

*Primary Examiner* — Nicholas Tobergte
(74) *Attorney, Agent, or Firm* — Knobbe Martens Olson & Bear LLP

(57) ABSTRACT

Systems, apparatuses, and methods related to the design, fabrication, and manufacture of gallium arsenide (GaAs) integrated circuits are disclosed. Copper can be used as the contact material for a GaAs integrated circuit. Metallization of the wafer and through-wafer vias can be achieved through copper plating processes disclosed herein. To avoid warpage, the tensile stress of a conductive layer deposited onto a GaAs substrate can be offset by depositing a compensating layer having negative stress over the GaAs substrate. GaAs integrated circuits can be singulated, packaged, and incorporated into various electronic devices.

22 Claims, 23 Drawing Sheets

(56) References Cited

U.S. PATENT DOCUMENTS

| | | |
|---|---|---|
| 2007/0066054 A1 | 3/2007 | Uzoh et al. |
| 2007/0210340 A1 | 9/2007 | Zampardi |
| 2011/0095436 A1 | 4/2011 | Chen et al. |
| 2011/0117739 A1 | 5/2011 | Tuttle |
| 2011/0217841 A1 | 9/2011 | Chen et al. |
| 2012/0205916 A1 | 8/2012 | Vuong |
| 2012/0258594 A1 | 10/2012 | Barth et al. |
| 2012/0295437 A1 | 11/2012 | Lu et al. |

\* cited by examiner

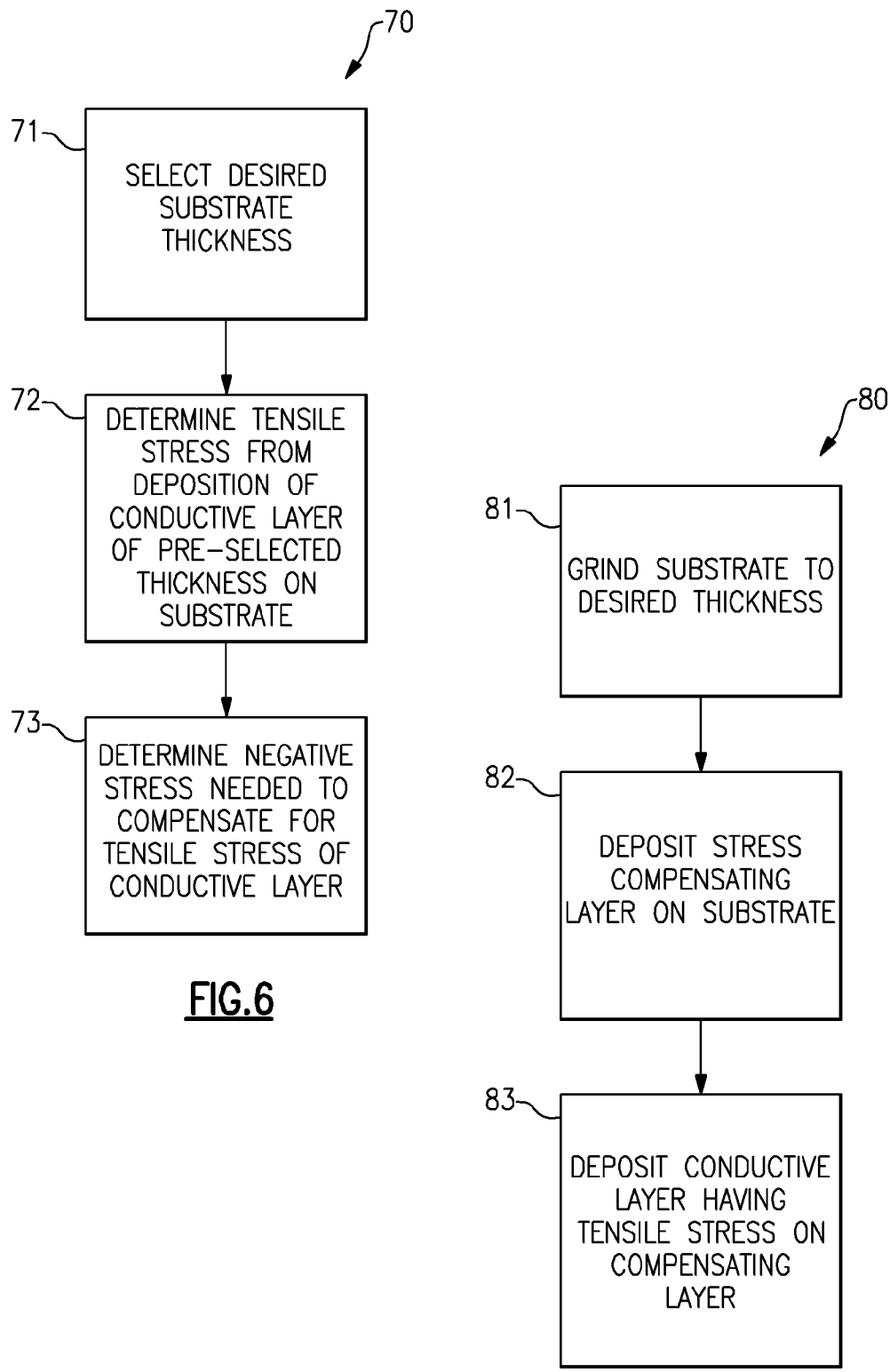

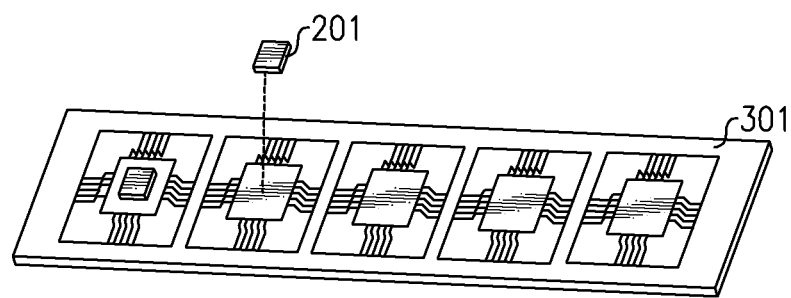
FIG.15A
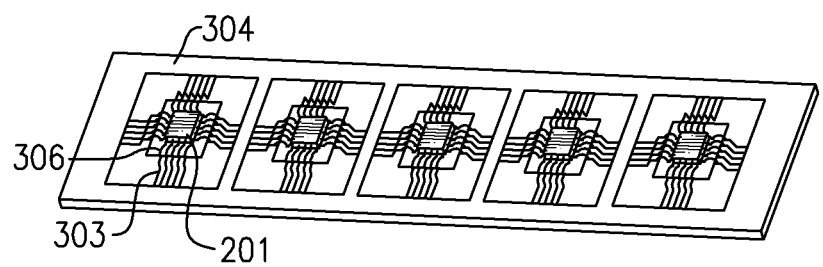
FIG.15B
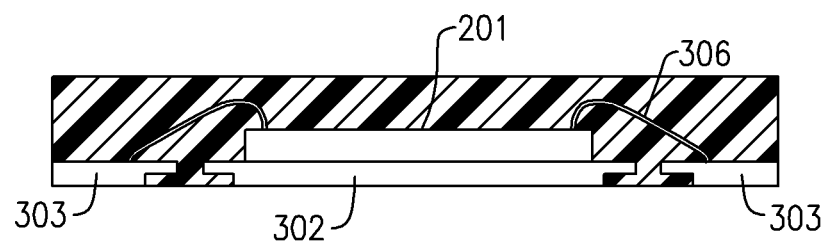
FIG.15C
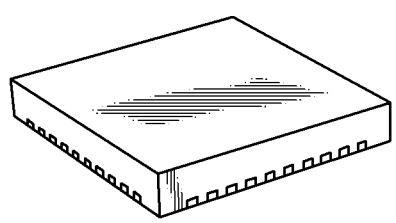 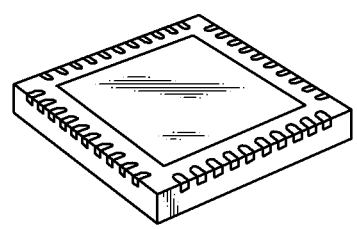
FIG.15D             FIG.15E

METHODS OF STRESS BALANCING IN GALLIUM ARSENIDE WAFER PROCESSING

BACKGROUND OF THE INVENTION

1. Field of the Invention

The present disclosure generally relates to the field of semiconductor wafer processing technology. In particular, this disclosure relates to the design, fabrication, and manufacture of gallium arsenide (GaAs) integrated circuits.

2. Description of the Related Art

The use of GaAs substrates in the design and construction of integrated circuits has proven to have desirable effects. For example, GaAs substrates have been useful in achieving greater performance in power amplifier circuits. Typically, a GaAs integrated circuit will be used as a component in a larger circuit device or design. In order to be integrated into the circuit design, the GaAs integrated circuit is mechanically and electrically coupled to a printed circuit board for the circuit device. In other cases, the GaAs integrated device is mounted to other electronic devices.

The contact side of the GaAs integrated circuit is typically adhered to a contact pad on the device's printed circuit board. More particularly, the integrated circuit usually includes a gold layer which adheres to the printed circuit board pad using a conductive adhesive. Often, the GaAs substrate has vias which extend into or through the substrate for facilitating electrical flow vertically through the substrate. These vias are also coated with the gold conductive material. Depositing the gold layer is a time-consuming and relatively inefficient process. Also, gold is an expensive material, increasing the cost for GaAs integrated circuit products. Finally, gold has a relatively high dissolution rate in solder, and therefore is not able to be soldered to the pad of the device's printed circuit board. Instead, conductive adhesive is typically used to adhere the gold contact to the printed circuit board. The use of conductive adhesive requires an additional manufacturing step, and also requires the use of larger pads to accommodate adhesive overflow. However, even with these undesirable features, gold continues to be the standard metal used for a contact layer on GaAs integrated circuits, which significantly drives up the product cost especially in recent years due to the high price of gold.

Accordingly, there is a need for improved GaAs integrated circuits that employ less costly component materials and can be more efficiently manufactured. Furthermore, there is a need for improved processes and methods for manufacturing such GaAs integrated circuits.

SUMMARY OF THE INVENTION

Methods for stress balancing in a GaAs wafer assembly are disclosed. In one embodiment, a method for stress balancing includes selecting a desired final thickness for a GaAs substrate, determining the tensile stress resulting from the deposition of a conductive layer of a pre-selected thickness onto the GaAs substrate, and determining the negative stress needed to compensate for the tensile stress of the conductive layer. As a result, the GaAs wafer assembly can remain substantially free of warpage. In some embodiments, the conductive layer can be a metal layer. The metal layer can be formed from, for example, copper, nickel, or palladium.

In one embodiment, a method for stress balancing in a GaAs wafer assembly is provided. The method generally includes the steps of selecting a desired final thickness for a GaAs substrate, determining tensile stress resulting from deposition of a conductive layer of a pre-selected thickness on the GaAs substrate, and determining negative stress needed to compensate the tensile stress of the conductive layer so that the GaAs wafer assembly remains substantially free of warpage. In one implementation, the conductive layer can be a metal layer formed from copper, nickel and/or palladium. In some implementations, the method further includes the step of selecting a stress compensating layer that induces sufficient compressive stress to the GaAs substrate so as to cancel the tensile stress on the GaAs substrate. The stress compensating layer can also be formed from a metal. Various stress-balanced semiconductor integrated circuits, such as GaAs integrated circuits with copper backside contact, can be made in accordance with the above-described method.

In another embodiment, a method of manufacturing a GaAs wafer assembly is provided. The method generally includes the steps of grinding a GaAs substrate to a final desired thickness, depositing a stress compensating layer on the GaAs substrate, and depositing a conductive layer having a tensile stress on the stress compensating layer such that that stress associated with the stress compensating layer cancels out the tensile stress of the conductive layer, resulting in a substantially warp-free wafer assembly. In some implementations, the stress compensating layer can be a conductive layer, for example a metal layer. In other implementations, the stress compensating also serves the function of a barrier layer that inhibits migration of contaminants from the conductive layer to the substrate. The stress compensating layer can be a metal layer that induces compressive stress on the GaAs substrate, such as for example a metal layer formed of nickel or palladium. The conductive layer having tensile stress can be a metal layer, for example a metal layer formed of copper, nickel, or palladium. Semiconductor integrated circuits, such as GaAs integrated circuits with copper backside contact, may be made in accordance with the various methods disclosed herein.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIG. 6 shows an example sequence of stress balancing in a GaAs wafer assembly.

FIG. 7 shows an example sequence of manufacturing a GaAs wafer assembly.

FIGS. 15A-15E show examples of structures at various stages of the processing sequence of FIG. 13, according to another embodiment.

DETAILED DESCRIPTION OF THE PREFERRED EMBODIMENT

The headings provided herein, if any, are for convenience only and do not necessarily affect the scope or meaning of the claimed invention.

GaAs Wafer Processing and Through Via Formation

Figure 1:
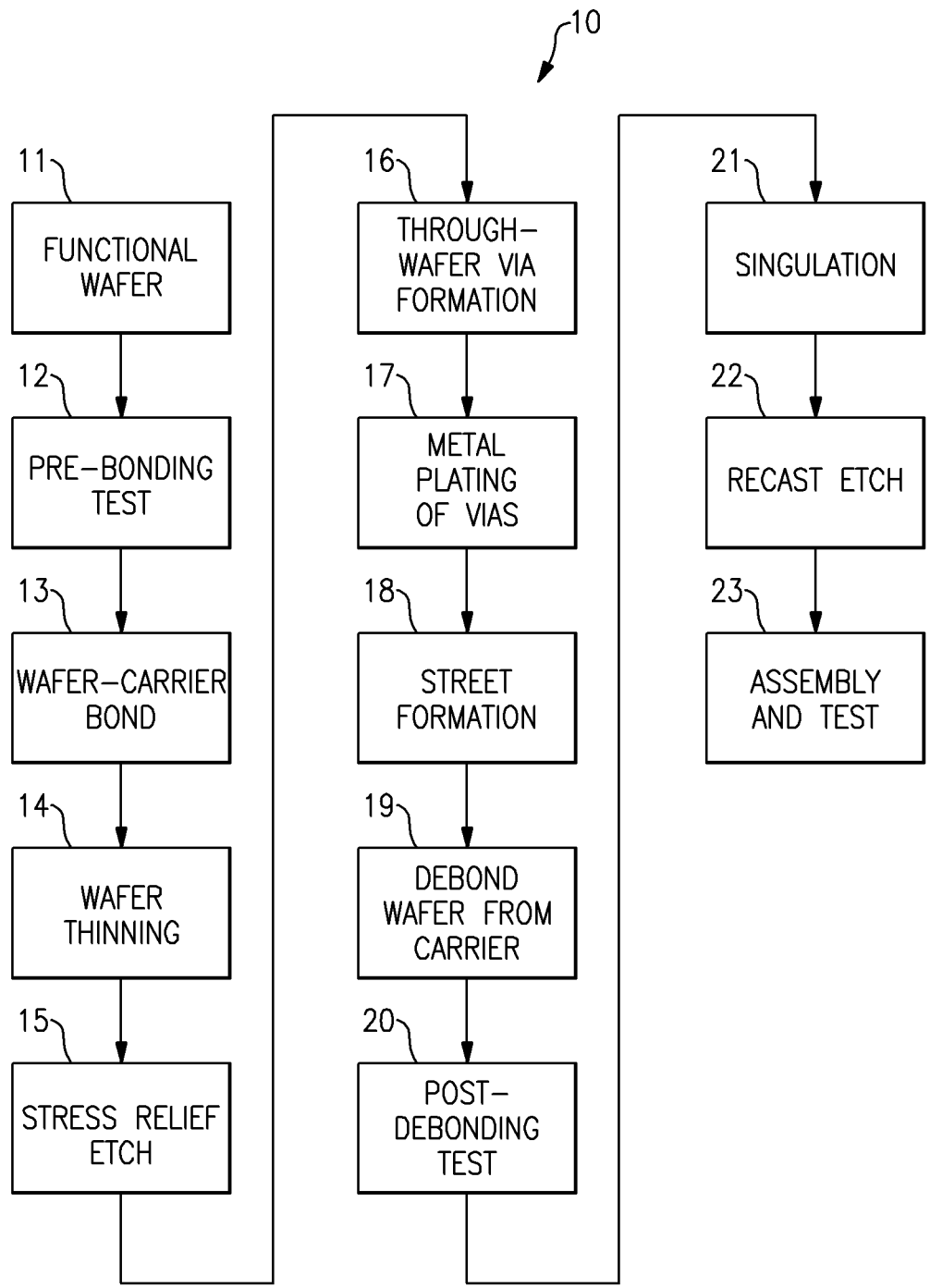
FIG. 1 shows an example sequence of wafer processing for forming through-wafer features such as vias.

Provided herein are various methodologies and devices for processing wafers such as GaAs wafers. FIG. 1 shows an example of a process 10 where a functional GaAs wafer is further processed to form through-wafer features such as vias and back-side metal layers.

In the description herein, various examples are described in the context of GaAs substrate wafers. It will be understood, however, that some or all of the features of the present disclosure can be implemented in processing of other types of semiconductor wafers. Further, some of the features can also be applied to situations involving non-semiconductor wafers.

In the description herein, various examples are described in the context of back-side processing of wafers. It will be understood, however, that some or all of the features of the present disclosure can be implemented in front-side processing of wafers.

Figure 2A:
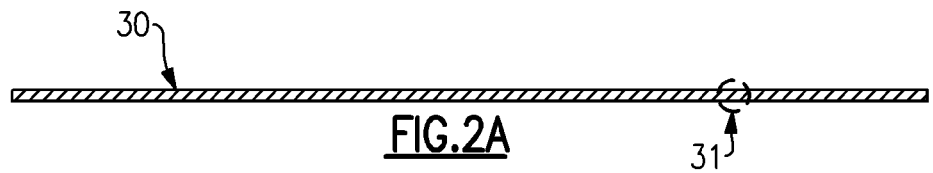
FIGS. 2A-2V show examples of structures at various stages of the processing sequence of FIG. 1.

In the process 10 of FIG. 1, a functional wafer can be provided (block 11). FIG. 2A depicts a side view of such a wafer 30 having first and second sides. The first side can be a front side, and the second side a back side.

Figure 2B:
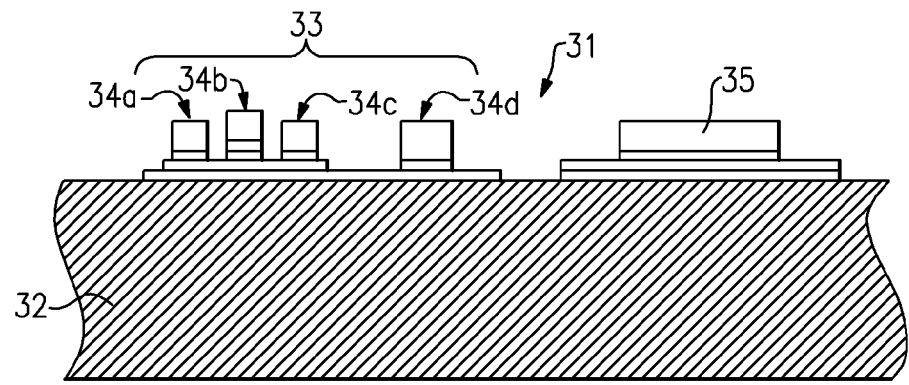

FIG. 2B depicts an enlarged view of a portion 31 of the wafer 30. The wafer 30 can include a substrate layer 32 (e.g., a GaAs substrate layer). The wafer 30 can further include a number of features formed on or in its front side. In the example shown, a transistor 33 and a metal pad 35 are depicted as being formed the front side. The example transistor 33 is depicted as having an emitter 34b, bases 34a, 34c, and a collector 34d. Although not shown, the circuitry can also include formed passive components such as inductors, capacitors, and source, gate and drain for incorporation of planar field effect transistors (FETs) with heterojunction bipolar transistors (HBTs). Such structures can be formed by various processes performed on epitaxial layers that have been deposited on the substrate layer.

Referring to the process 10 of FIG. 1, the functional wafer of block 11 can be tested (block 12) in a number of ways prior to bonding. Such a pre-bonding test can include, for example, DC and RF tests associated with process control parameters.

Figure 2C:
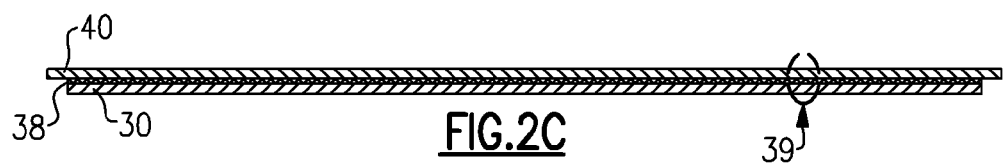

Upon such testing, the wafer can be bonded to a carrier (block 13). In certain implementations, such a bonding can be achieved with the carrier above the wafer. Thus, FIG. 2C shows an example assembly of the wafer 30 and a carrier 40 (above the wafer) that can result from the bonding step 13. In certain implementations, the wafer and carrier can be bonded using temporary mounting adhesives such as wax or commercially available Crystalbond™. In FIG. 2C, such an adhesive is depicted as an adhesive layer 38.

In certain implementations, the carrier 40 can be a plate having a shape (e.g., circular) similar to the wafer it is supporting. Preferably, the carrier plate 40 has certain physical properties. For example, the carrier plate 40 can be relatively rigid for providing structural support for the wafer. In another example, the carrier plate 40 can be resistant to a number of chemicals and environments associated with various wafer processes. In another example, the carrier plate 40 can have certain desirable optical properties to facilitate a number of processes (e.g., transparency to accommodate optical alignment and inspections)

Materials having some or all of the foregoing properties can include sapphire, borosilicate (also referred to as Pyrex), quartz, and glass (e.g., SCG72).

In certain implementations, the carrier plate 40 can be dimensioned to be larger than the wafer 30. Thus, for circular wafers, a carrier plate can also have a circular shape with a diameter that is greater than the diameter of a wafer it supports. Such a larger dimension of the carrier plate can facilitate easier handling of the mounted wafer, and thus can allow more efficient processing of areas at or near the periphery of the wafer.

Tables 1A and 1B list various example ranges of dimensions and example dimensions of some example circular-shaped carrier plates that can be utilized in the process 10 of FIG. 1.

TABLE 1A

| Carrier plate diameter range | Carrier plate thickness range | Wafer size |
|---|---|---|
| Approx. 100 to 120 mm | Approx. 500 to 1500 um | Approx. 100 mm |
| Approx. 150 to 170 mm | Approx. 500 to 1500 um | Approx. 150 mm |
| Approx. 200 to 220 mm | Approx. 500 to 2000 um | Approx. 200 mm |
| Approx. 300 to 320 mm | Approx. 500 to 3000 um | Approx. 300 mm |

TABLE 1B

| Carrier plate diameter | Carrier plate thickness | Wafer size |
|---|---|---|
| Approx. 110 mm | Approx. 1000 um | Approx. 100 mm |
| Approx. 160 mm | Approx. 1300 um | Approx. 150 mm |
| Approx. 210 mm | Approx. 1600 um | Approx. 200 mm |
| Approx. 310 mm | Approx. 1900 um | Approx. 300 mm |

Figure 2D:
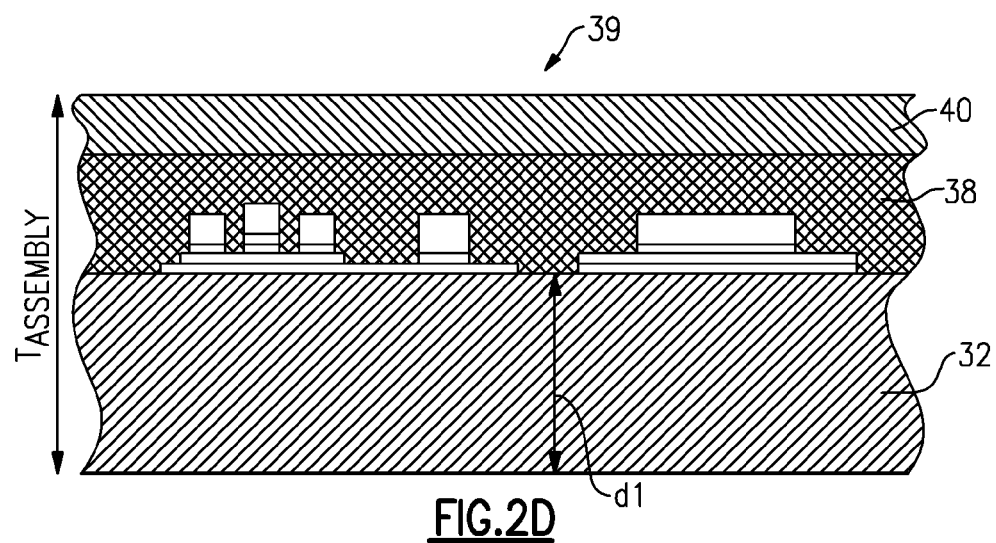

An enlarged portion 39 of the bonded assembly in FIG. 2C is depicted in FIG. 2D. The bonded assembly can include the GaAs substrate layer 32 on which are a number of devices such as the transistor (33) and metal pad (35) as described in reference to FIG. 2B. The wafer (30) having such substrate (32) and devices (e.g., 33, 35) is depicted as being bonded to the carrier plate 40 via the adhesive layer 38.

As shown in FIG. 2D, the substrate layer 32 at this stage has a thickness of d1, and the carrier plate 40 has a generally fixed thickness (e.g., one of the thicknesses in Table 1). Thus, the overall thickness (Tassembly) of the bonded assembly can be determined by the amount of adhesive in the layer 38.

In a number of processing situations, it is preferable to provide sufficient amount of adhesive to cover the tallest feature(s) so as to yield a more uniform adhesion between the wafer and the carrier plate, and also so that such a tall feature does not directly engage the carrier plate. Thus, in the example shown in FIG. 2D, the emitter feature (34b in FIG. 2B) is the tallest among the example features; and the adhesive layer 38 is sufficiently thick to cover such a feature and provide a relatively uninterrupted adhesion between the wafer 30 and the carrier plate 40.

Figure 2E:
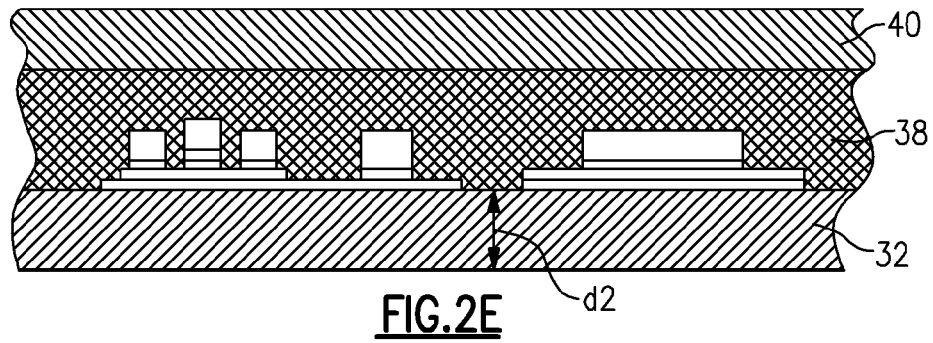

Referring to the process 10 of FIG. 1, the wafer—now mounted to the carrier plate—can be thinned so as to yield a desired substrate thickness in blocks 14 and 15. In block 14, the back side of the substrate 32 can be ground away (e.g., via two-step grind with coarse and fine diamond-embedded grinding wheels) so as to yield an intermediate thickness-substrate (with thickness d2 as shown in FIG. 2E) with a relatively rough surface. In certain implementations, such a grinding process can be performed with the bottom surface of the substrate facing downward.

In block 15, the relatively rough surface can be removed so as to yield a smoother back surface for the substrate 32. In certain implementations, such removal of the rough substrate surface can be achieved by an $O_2$ plasma ash process, followed by a wet etch process utilizing acid or base chemistry. Such an acid or base chemistry can include HCl, $H_2SO_4$, $HNO_3$, $H_3PO_4$, $H_3COOH$, $NH_4OH$, $H_2O_2$, etc., mixed with $H_2O_2$ and/or $H_2O$. Such an etching process can provide relief from possible stress on the wafer due to the rough ground surface.

Figure 2F:
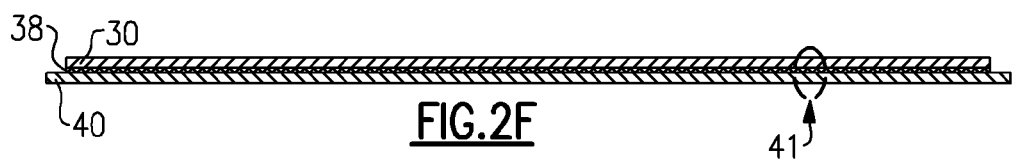
Figure 2G:
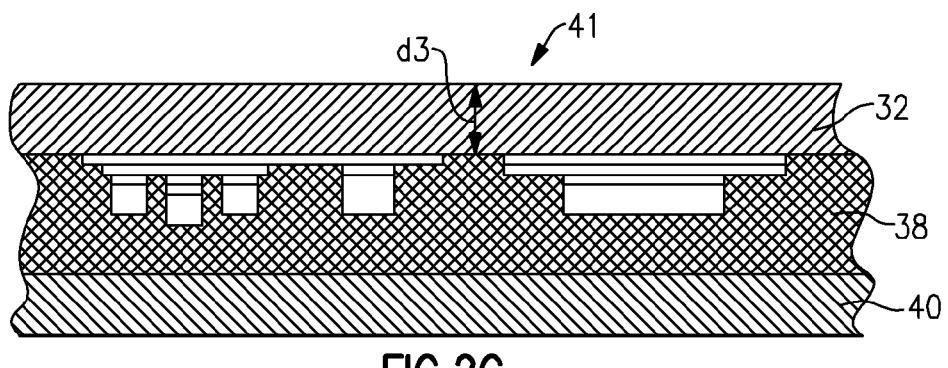

In certain implementations, the foregoing plasma ash and wet etch processes can be performed with the back side of the substrate 32 facing upward. Accordingly, the bonded assembly in FIG. 2F depicts the wafer 30 above the carrier plate 40. FIG. 2G shows the substrate layer 32 with a thinned and smoothed surface, and a corresponding thickness of d3.

By way of an example, the pre-grinding thickness (d1 in FIG. 2D) of a 150 mm (also referred to as "6-inch") GaAs substrate can be approximately 675 µm. The thickness d2 (FIG. 2E) resulting from the grinding process can be in a range of approximately 102 µm to 120 µm. The ash and etching processes can remove approximately 2 µm to 20 µm of the rough surface so as to yield a thickness of approximately 100 µm. (d3 in FIG. 2G). Other thicknesses are possible.

In certain situations, a desired thickness of the back-side-surface-smoothed substrate layer can be an important design parameter. Accordingly, it is desirable to be able to monitor the thinning (block 14) and stress relief (block 15) processes. Since it can be difficult to measure the substrate layer while the wafer is bonded to the carrier plate and being worked on, the thickness of the bonded assembly can be measured so as to allow extrapolation of the substrate layer thickness. Such a measurement can be achieved by, for example, a gas (e.g., air) back pressure measurement system that allows detection of surfaces (e.g., back side of the substrate and the "front" surface of the carrier plate) without contact.

As described in reference to FIG. 2D, the thickness ($T_{assembly}$) of the bonded assembly can be measured; and the thicknesses of the carrier plate 40 and the un-thinned substrate 32 can have known values. Thus, subsequent thinning of the bonded assembly can be attributed to the thinning of the substrate 32; and the thickness of the substrate 32 can be estimated.

Figure 2H:
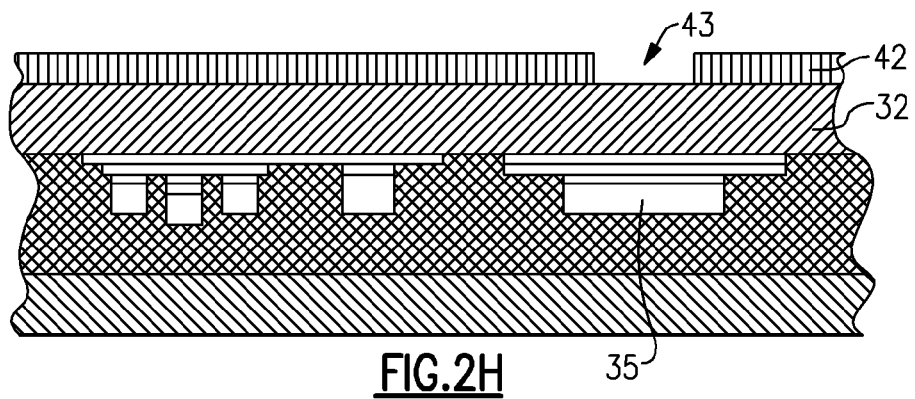
Figure 2I:
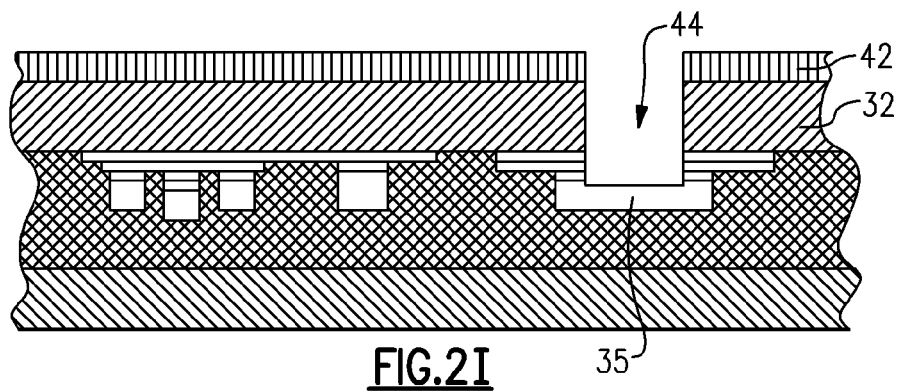
Figure 2J:
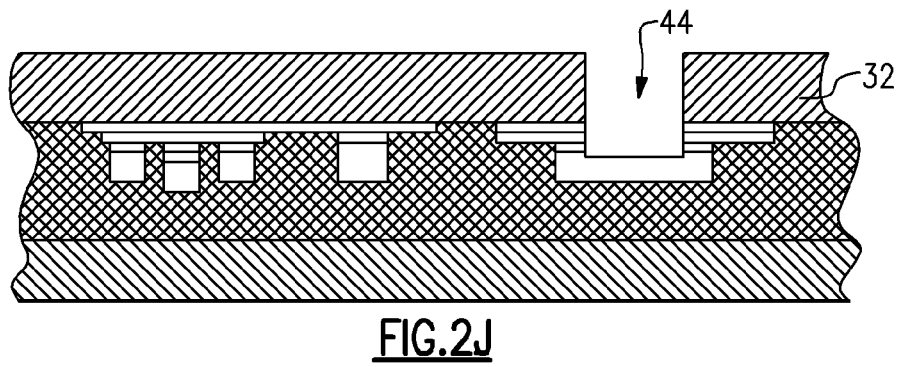

Referring to the process 10 of FIG. 1, the thinned and stress-relieved wafer can undergo a through-wafer via formation process (block 16). FIGS. 2H-2J show different stages during the formation of a via 44. Such a via is described herein as being formed from the back side of the substrate 32 and extending through the substrate 32 so as to end at the example metal pad 35. It will be understood that one or more features described herein can also be implemented for other deep features that may not necessarily extend all the way through the substrate. Moreover, other features (whether or not they extend through the wafer) can be formed for purposes other than providing a pathway to a metal feature on the front side.

To form an etch resist layer 42 that defines an etching opening 43 (FIG. 2H), photolithography can be utilized. Coating of a resist material on the back surface of the substrate, exposure of a mask pattern, and developing of the exposed resist coat can be achieved in known manners. In the example configuration of FIG. 2H, the resist layer 42 can have a thickness in a range of about 15 µm to 20 µm.

To form a through-wafer via 44 (FIG. 2I) from the back surface of the substrate to the metal pad 35, techniques such as dry inductively coupled plasma (ICP) etching (with chemistry such as $BCl_3/Cl_2$) can be utilized. In various implementations, a desired shaped via can be an important design parameter for facilitating proper metal coverage therein in subsequent processes.

FIG. 2J shows the formed via 44, with the resist layer 42 removed. To remove the resist layer 42, photoresist strip solvents such as NMP (N-methyl-2-pyrrolidone) and EKC can be applied using, for example, a batch spray tool. In various implementations, proper removal of the resist material 42 from the substrate surface can be an important consideration for subsequent metal adhesion. To remove residue of the resist material that may remain after the solvent strip process, a plasma ash (e.g., $O_2$) process can be applied to the back side of the wafer.

Figure 2K:
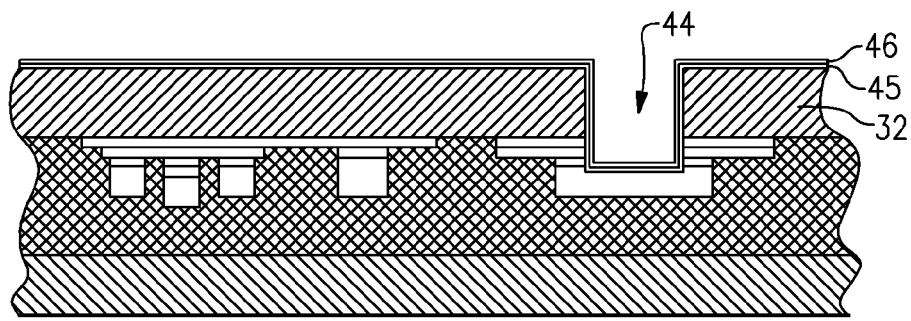
Figure 2L:
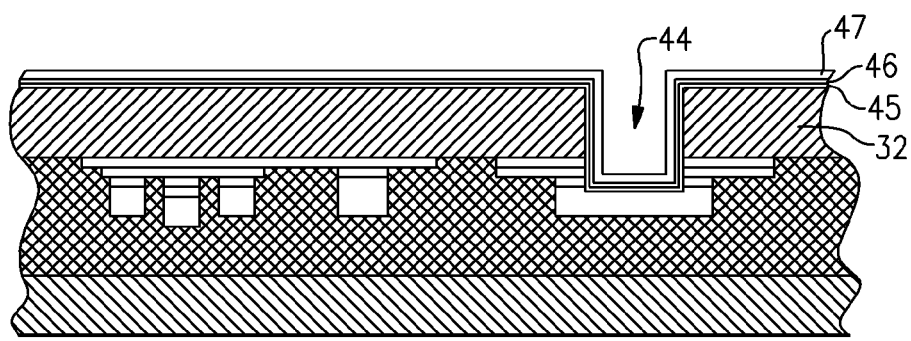

Referring to the process 10 of FIG. 1, a metal layer can be formed on the back surface of the substrate 32 in block 17. FIGS. 2K and 2L show examples of adhesion/seed layers and a thicker metal layer.

FIG. 2K shows that in certain implementations, an adhesion layer 45 such as a nickel vanadium (NiV) layer can be formed on surfaces of the substrate's back side and the via 44 by, for example, sputtering. Preferably, the surfaces are cleaned (e.g., with HCl) prior to the application of NiV. FIG. 2K also shows that a seed layer 46 such as a thin gold layer can be formed on the adhesion layer 45 by, for example, sputtering. Such a seed layer facilitates formation of a thick metal layer 47 such as a thick gold layer shown in FIG. 2L. In certain implementations, the thick gold layer can be formed by a plating technique.

In certain implementations, the gold plating process can be performed after a pre-plating cleaning process (e.g., $O_2$ plasma ash and HCl cleaning). The plating can be performed to form a gold layer of about 3 µm to 6 µm to facilitate the foregoing electrical connectivity and heat transfer functionalities. The plated surface can undergo a post-plating cleaning process (e.g., $O_2$ plasma ash).

The metal layer formed in the foregoing manner forms a back side metal plane that is electrically connected to the metal pad 35 on the front side. Such a connection can provide a robust electrical reference (e.g., ground potential) for the metal pad 35. Such a connection can also provide an efficient pathway for conduction of heat between the back side metal plane and the metal pad 35.

Thus, one can see that the integrity of the metal layer in the via 44 and how it is connected to the metal pad 35 and the back side metal plane can be important factors for the performance of various devices on the wafer. Accordingly, it is desirable to have the metal layer formation be implemented in an effective manner. More particularly, it is desirable to provide an effective metal layer formation in features such as vias that may be less accessible.

Figure 2M:
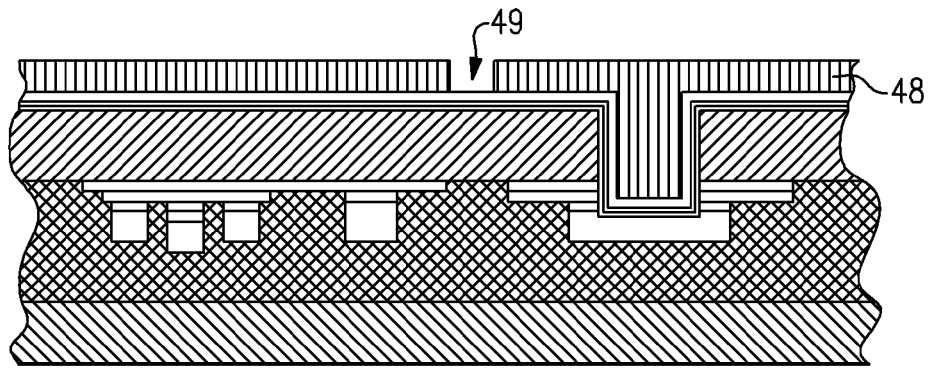
Figure 2N:
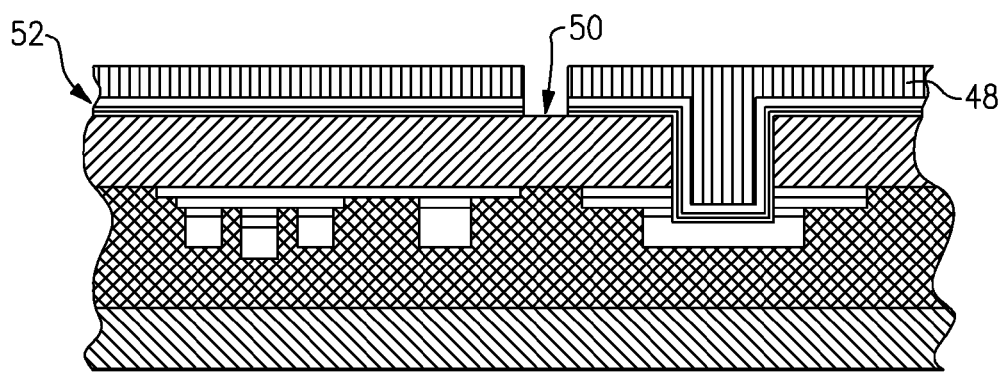
Figure 2O:
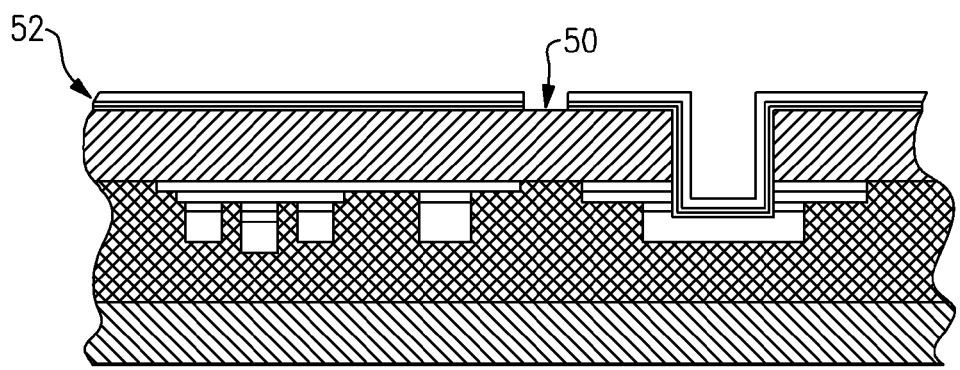

Referring to the process 10 of FIG. 1, the wafer having a metal layer formed on its back side can undergo a street formation process (block 18). FIGS. 2M-2O show different stages during the formation of a street 50. Such a street is described herein as being formed from the back side of the wafer and extending through the metal layer 52 to facilitate subsequent singulation of dies. It will be understood that one or more features described herein can also be implemented for other street-like features on or near the back surface of the wafer. Moreover, other street-like features can be formed for purposes other than to facilitate the singulation process.

To form an etch resist layer 48 that defines an etching opening 49 (FIG. 2M), photolithography can be utilized. Coating of a resist material on the back surface of the substrate, exposure of a mask pattern, and developing of the exposed resist coat can be achieved in known manners.

To form a street 50 (FIG. 2N) through the metal layer 52, techniques such as wet etching (with chemistry such as potassium iodide) can be utilized. A pre-etching cleaning process (e.g., $O_2$ plasma ash) can be performed prior to the etching process. In various implementations, the thickness of the resist 48 and how such a resist is applied to the back side of the wafer can be important considerations to prevent certain undesirable effects, such as via rings and undesired etching of via rim during the etch process.

FIG. 2O shows the formed street 50, with the resist layer 48 removed. To remove the resist layer 48, photoresist strip solvents such as NMP (N-methyl-2-pyrrolidone) can be applied using, for example, a batch spray tool. To remove residue of the resist material that may remain after the solvent strip process, a plasma ash (e.g., $O_2$) process can be applied to the back side of the wafer.

In the example back-side wafer process described in reference to FIGS. 1 and 2, the street (50) formation and removal of the resist (48) yields a wafer that no longer needs to be mounted to a carrier plate. Thus, referring to the process 10 of FIG. 1, the wafer is debonded or separated from the carrier plate in block 19. FIGS. 2P-2R show different stages of the separation and cleaning of the wafer 30.

Figure 2P:
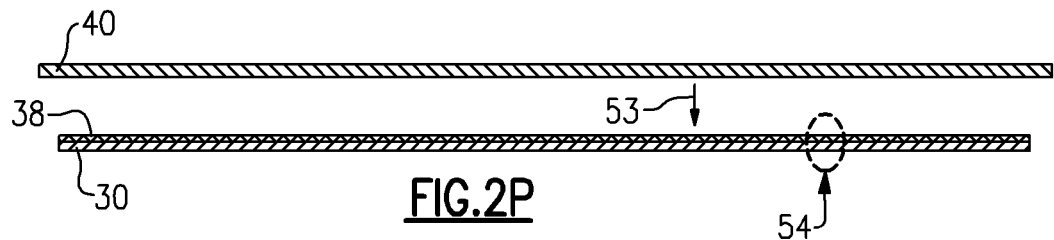

In certain implementations, separation of the wafer 30 from the carrier plate 40 can be performed with the wafer 30 below the carrier plate 40 (FIG. 2P). To separate the wafer 30 from the carrier plate 40, the adhesive layer 38 can be heated to reduce the bonding property of the adhesive. For the example Crystalbond™ adhesive, an elevated temperature to a range of about 130° C. to 170° C. can melt the adhesive to facilitate an easier separation of the wafer 30 from the carrier plate 40. Some form of mechanical force can be applied to the wafer 30, the carrier plate 40, or some combination thereof, to achieve such separation (arrow 53 in FIG. 2P). In various implementations, achieving such a separation of the wafer with reduced likelihood of scratches and cracks on the wafer can be an important process parameter for facilitating a high yield of good dies.

Figure 2Q:
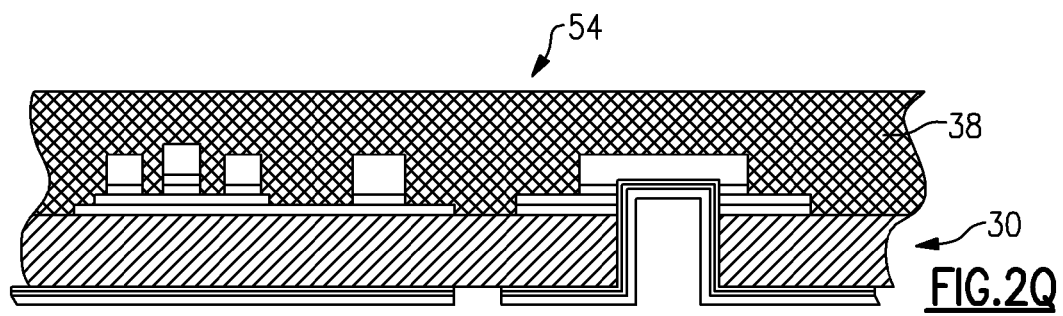

In FIGS. 2P and 2Q, the adhesive layer 38 is depicted as remaining with the wafer 30 instead of the carrier plate 40. It will be understood that some adhesive may remain with the carrier plate 40.

Figure 2R:
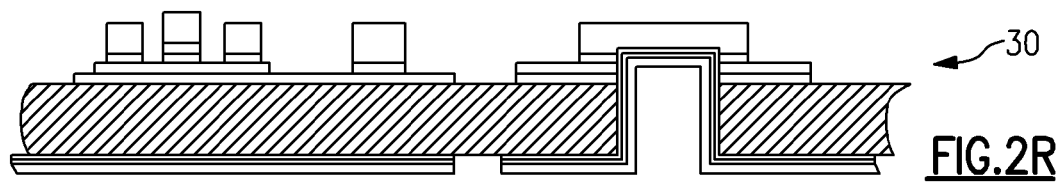

FIG. 2R shows the adhesive 38 removed from the front side of the wafer 30. The adhesive can be removed by a cleaning solution (e.g., acetone), and remaining residues can be further removed by, for example, a plasma ash (e.g., $O_2$) process.

Referring to the process 10 of FIG. 1, the debonded wafer of block 19 can be tested (block 20) in a number of ways prior to singulation. Such a post-debonding test can include, for example, resistance of the metal interconnect formed on the through-wafer via using process control parameters on the front side of the wafer. Other tests can address quality control associated with various processes, such as quality of the through-wafer via etch, seed layer deposition, and gold plating.

Figure 2S:
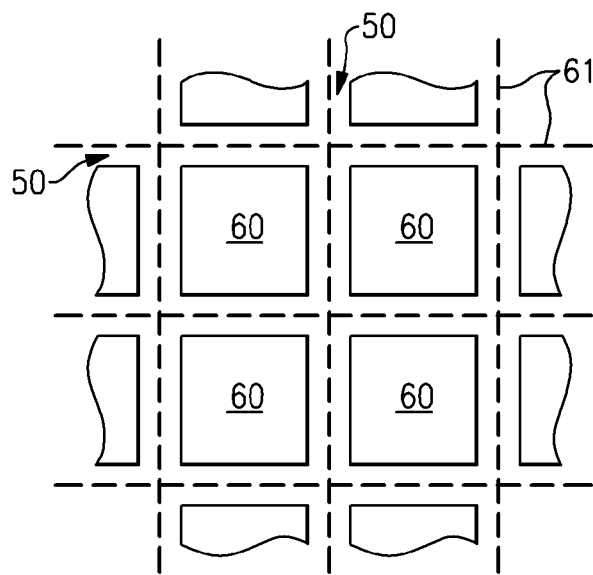

Referring to the process 10 of FIG. 1, the tested wafer can be cut to yield a number of dies (block 21). In certain implementations, at least some of the streets (50) formed in block 18 can facilitate the cutting process. FIG. 2S shows cuts 61 being made along the streets 50 so as to separate an array of dies 60 into individual dies. Such a cutting process can be achieved by, for example, a diamond scribe and roller break, saw or a laser.

Figure 2T:
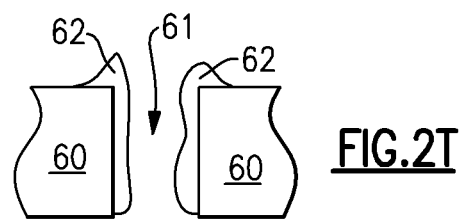

In the context of laser cutting, FIG. 2T shows an effect on the edges of adjacent dies 60 cut by a laser. As the laser makes the cut 61, a rough edge feature 62 (commonly referred to as recast) typically forms. Presence of such a recast can increase the likelihood of formation of a crack therein and propagating into the functional part of the corresponding die.

Figure 2U:
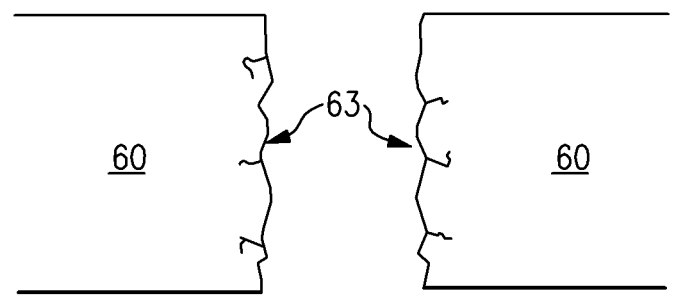
Figure 2V:
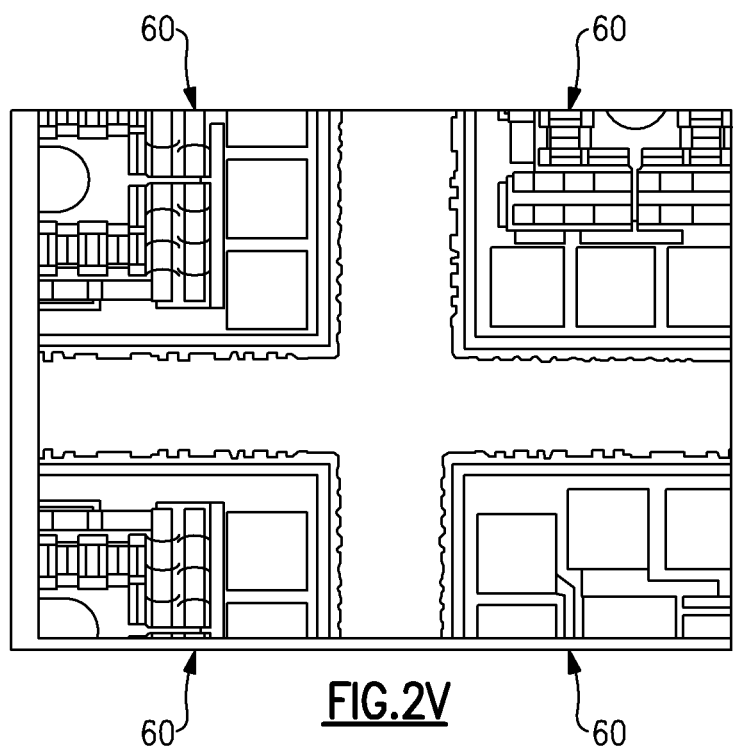

Thus, referring to the process 10 in FIG. 1, a recast etch process using acid and/or base chemistry (e.g., similar to the examples described in reference to block 15) can be performed in block 22. Such etching of the recast feature 62 and defects formed by the recast, increases the die strength and reduces the likelihood of die crack failures (FIG. 2U).

Referring to the process 10 of FIG. 1, the recast etched dies (FIG. 2V) can be further inspected and subsequently be packaged.

It will be understood that the processing steps described above can be implemented in the example through-wafer via process described in reference to FIGS. 1 and 2, as well as in other processing situations. It will also be understood that one or more processing steps can be implemented in different types of semiconductor-based wafers, including but not limited to those formed from semiconductor materials such as groups IV, III-V, II-VI, I-VII, IV-VI, V-VI, II-V; oxides; layered semiconductors; magnetic semiconductors; organic semiconductors; charge-transfer complexes; and other semiconductors.

Copper Metallization

While metallization of vias and backside contact of GaAs integrated circuits is typically performed using gold, other integrated circuit technologies, such as silicon-based technologies, use copper (Cu) for a contact layer. Cu has superior conductivity, may be applied more uniformly, and is less costly than gold. Further, Cu has a sufficiently low dissolution rate in solder, so allows the integrated circuit device to be soldered to its printed circuit board pad. Cu, however, readily oxidizes, which degrades electrical and mechanical characteristics. Accordingly, when used in silicon processes, the Cu is typically applied in thick layers, polished, and then capped with dielectric materials such as silicon nitride to avoid these oxidation effects.

Although Cu has been used successfully in silicon wafer technology, to the best of the inventors' knowledge, Cu has not been successfully used in GaAs integrated circuit devices. A number of obstacles have hindered the effective use of copper in metallization of GaAs devices. For example, Cu is an unintentional source of impurity, and is often proven to be the leading cause of GaAs device failures. Cu rapidly diffuses into GaAs substrates, at a rate faster than the diffusion of gold into GaAs substrates, and faster than the diffusion of Cu into silicon substrates. Once Cu diffuses into source/gate/drain region of a field effect transistor (FET) or active areas of a heterojunction bipolar transistor (HBT), the device will degrade, and eventually fail electrically. Unlike gold, Cu can diffuse into GaAs and create deep energy levels in the GaAs band gap region. These deep levels will trap charges, which lead to degradation and failure of the GaAs devices.

Without wishing to be bound by theory, the inventors have determined that there are three mechanisms of Cu diffusion in GaAs. The first is bulk or lattice diffusion, which involves vacancies in the GaAs lattice and the exchange of Cu atoms between layers in the GaAs lattice. Bulk diffusion is highly temperature dependent. The second mechanism is the intermetallic compound formation between Cu and GaAs. The third mechanism is interstitial diffusion, in which Cu atoms move along defects, dislocations, or grain boundaries in GaAs. This third mechanism is of particular importance because during processing, the GaAs surface is often damaged. Consequently, there are voids, dislocations, and other defects present on the GaAs surface, which facilitate the movement of Cu atoms within the GaAs lattice structure.

Accordingly, the use of Cu typically results in the destruction or nonoperation of GaAs integrated circuits. Further, Cu readily oxidizes, and so is difficult to use as a contact material in GaAs integrated circuits without any protection. It is therefore necessary to modify the process outlined above in order to permit the use of Cu to form the metal layer lining the back side of the wafer and the surface of the vias. Certain aspects of the present invention are directed to novel process modifications and techniques which the inventors have developed to overcome at least some of the obstacles in using copper for via and backside metallization of GaAs integrated circuits.

To overcome the obstacles associated with effectively substituting copper for at least some of the gold in vias and back-side metal layers of GaAs integrated circuits, the inventors have developed modified processes, particularly for reducing wafer cracking or warpage due to stress incurred during backside wafer metallization processes. Wafer cracking and warping can occur when changes in wafer processing such as adding materials or altering stress of the material during backside and front side metallization, backside grinding, and other wafer processes. Metallization of copper tends to induce even higher stress and warpage on the wafers.

Certain preferred embodiments of the invention relate to novel processes and techniques designed to balance stress on a GaAs wafer to reduce the detrimental effects of stress incurred during copper backside metallization, wafer grinding, and other processes. Before discussing in greater detail such novel processes and techniques, a backside metallization process developed for copper will be first described below.

Figure 3:
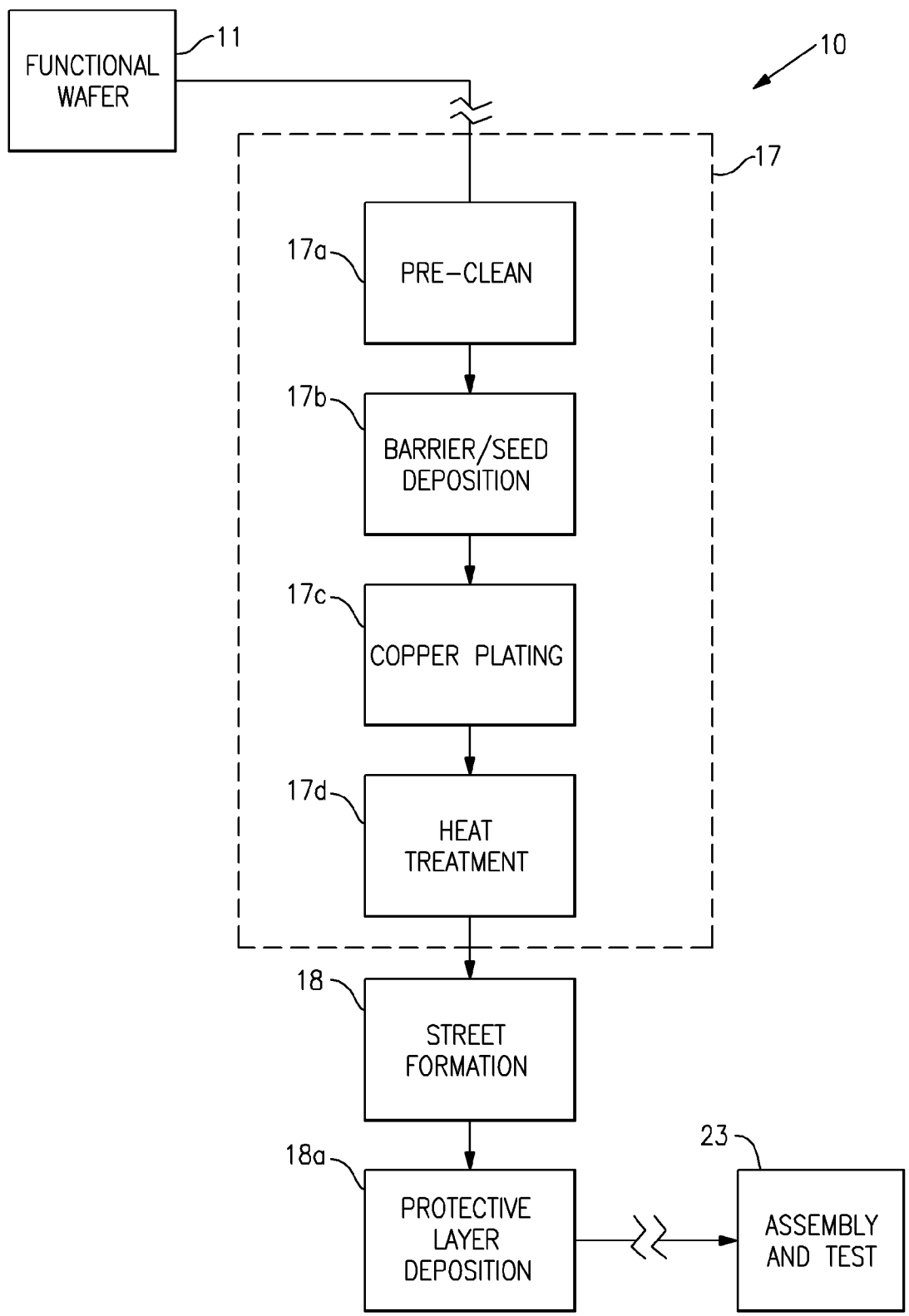
FIG. 3 is a block diagram representing the via metallization process according to various aspects of the present invention.

FIG. 3 shows one embodiment of a modified via metallization process represented in Block 17 of FIG. 1, which is developed for copper metallization of a GaAs integrated circuit. FIGS. 4A-4D show examples of cross sectional diagrams of a section of a GaAs wafer formed in accordance the process shown in FIG. 3.

Figure 4A:
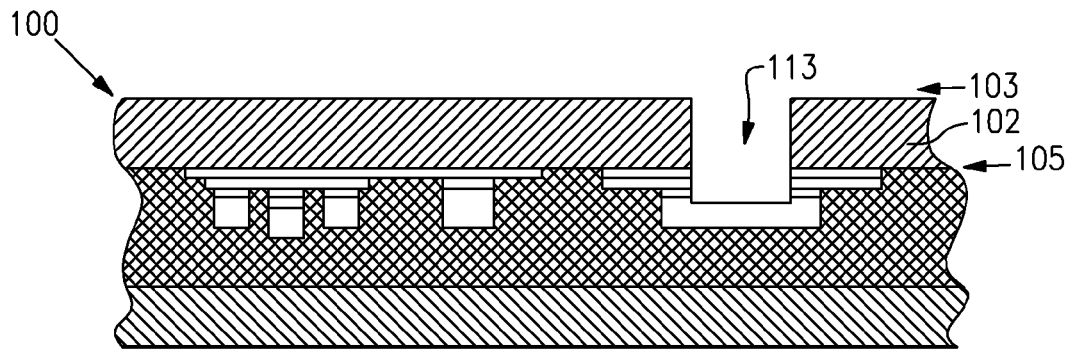
FIGS. 4A-4D show examples of structures at various stages of the processing sequence of FIG. 3.

In the process 10 of FIG. 3, the via metallization process (block 17) begins with a pre-clean step (block 17a). FIG. 4A depicts the formed via 113 processed through the pre-clean step 17a. In various implementations, the pre-clean step removes residues and other contamination from the via 113 and back surface 103 of the substrate 102 and activates the surfaces for subsequent metal adhesion.

Figure 4B:
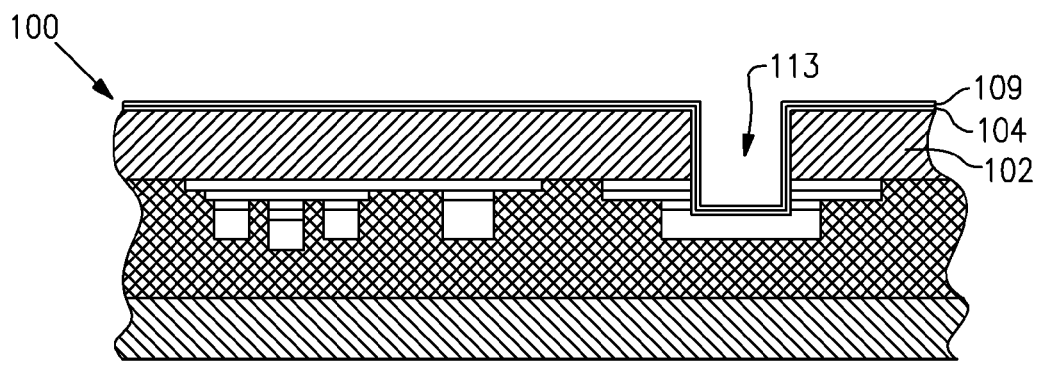

Referring to the process 10 of FIG. 3, a metal barrier and seed layer can be formed in the via 113 and on the back surface 103 of the substrate 102 in block 17b. FIG. 4B shows an example of a seed layer 109 and a metal barrier layer 104 that can be formed in the via 113 and on the back surface 103 of the substrate 102.

Figure 4C:
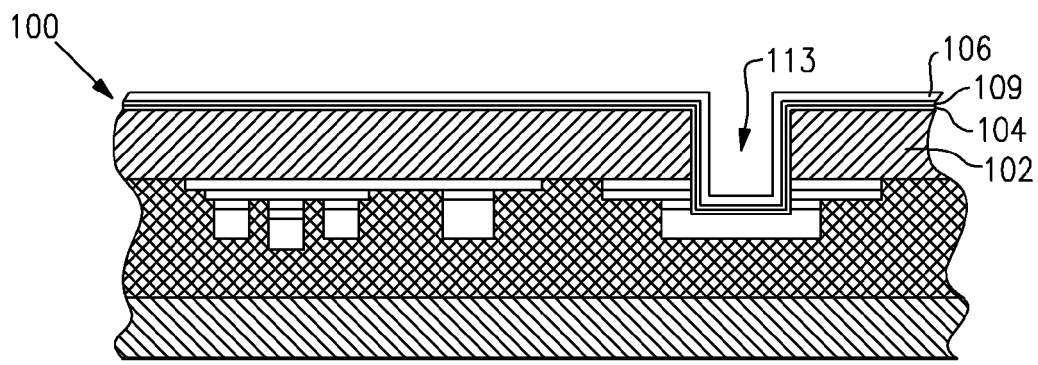

Referring to the process 10 of FIG. 3, a copper layer is formed in the via 113 and on the back surface 103 of the substrate 32 in block 17c. FIG. 4C shows an example of a copper contact layer 106 that can be formed in the via 113 and on the back surface 103 of the substrate 102. The copper contact layer 106 can replace some or all of the gold contact layer that is typically deposited in the via 113 and on the back surface 103. As FIG. 3 further shows, in some embodiments, an optional heat treatment step in block 17d can follow the copper deposition process.

In some implementations of the embodiment shown in FIG. 3, the via metallization process (blocks 17a-17d) is followed by street formation (block 18), and deposition of a protective layer deposition (block 18a) before debonding wafer from carrier.

FIGS. 4A-4D show examples of cross sectional diagrams of a section of a GaAs wafer with a via formed in accordance with embodiments of the process 10 in FIG. 3 is illustrated. Section 100 has via 113 extending through a GaAs substrate 102. Referring to the process 10 of FIG. 3, the via 113 may be pre-cleaned (block 17a). The via 113 and back side 105 of the GaAs wafer 102 may be cleaned using, for example HCl and/or an $O_2$ plasma ash process.

Following cleaning, the via may be barrier layer followed by a seed layer may be deposited (block 17b). First a barrier layer 104 is deposited on the contact side 105 of the GaAs substrate 102. In one example, the barrier layer 104 is a nickel vanadium (NiV) layer disposed at about 800 angstroms thickness. The NiV may be deposited using a physical vapor deposition process (commonly known as sputtering), or other known deposition process. The NiV provides an effective diffusion barrier between the GaAs substrate and the copper contact layer 106, which will be applied later. Since copper is known to have an undesirable diffusion effect on GaAs, the NiV is deposited in a relatively thick layer. It will be appreciated that the thickness of the layer may be adjusted according to the needs of the particular application. For example, devices subjected to long-term use may require thicker layers, and the layer may be adjusted according to other material used, for example, in the seed layer 109.

A seed layer 109 may then be deposited on the barrier layer 104. Although the seed layer 109 may not always be necessary, it has been found that a seed layer facilitates better mechanical and electrical connection of the copper contact layer. The metal seed layer may be, for example, either a copper layer or a gold layer, and may be deposited at a thickness of about 700 angstroms using a physical vapor deposition process. If copper is used as the seed layer, then an activation process may need to be performed at a later time if the copper has been allowed to oxidize.

The via 113 may then be plated with copper (block 17c). The copper contact layer 106 is deposited on the seed layer 109, if present. The copper contact layer 106 is deposited using an electroplating process. The copper is deposited at a relatively uniform thickness, such as about 6 μm. It will be appreciated that other types of processes and thicknesses may be used. Depending on the size of the via 113, the copper may simply coat the walls, or may nearly fill the via. To facilitate faster production, a 6 μm coating of the copper contact layer 106 typically provides sufficient electrical conduction, while leaving a central opening in via 113.

One typical electroplating process involves the use of a copper sulfate ($CuSO_4$) bath. Typical $CuSO_4$ based electroplating chemistry contains a small amount of chloride ions, a suppressor component such as polyethylene glycol (PEG), an accelerator component such as bis(sodiumsulfopropyl) disulfide (SPS), and in most cases a nitrogen based leveling agent such as thiourea. A competition model has been understood to explain the mechanism of via fill in semiconductor circuit fabrication. According to this model, chloride is complexed with the suppressor. Due to the long chain polymer nature of the suppressor, it is unable to diffuse rapidly into a via formed on a semiconductor wafer. The accelerator, on the other hand, is often a relatively small molecule, which can diffuse much more rapidly than the suppressor into the via. As a result, the suppressor will primarily accumulate on the surface of the semiconductor wafer, whereas the accelerator will primarily accumulate inside the via. The higher concentration of the accelerator increases the plating rate of copper deposition within the via. On the surface of the wafer, however, the suppressor functions as a diffusion barrier to prevent copper ions from diffusing onto the surface, and consequently preventing reduction of the copper ions to copper metal. The accelerator-copper complex will gradually replace the suppressor-chloride complex on the wafer surface, such that copper will then be plated on the surface of the wafer, albeit at a rate slower than the plating inside the via. This difference in diffusion mechanism between the suppressor and accelerator complexes, combined with the competitive interaction between them, contribute to the bottom-up fill of copper metallization inside the via.

Following the copper plating, the GaAs wafer 102 is subjected to an optional heat treatment (block 17*d*). The metallization process can continue for 48 hours or more. Such a long process disadvantageously extends production time GaAs integrated circuit devices. Additionally, this slow process results in copper structure with significant defects, cracks, etc caused by the slow growth. Adding heat to the process both significantly accelerates the metallization process and increase the quality and uniformity of the copper grain structure. In typical PECVD processes, the heat treatment involves application of temperatures between 200 to 300° C. These temperatures may exceed the melting point for the adhesive used to bond the wafer to the carrier. Subjecting GaAs wafers mounted onto carriers to such high temperatures may therefore disadvantageously decrease the bonding strength of the carrier and wafer. Accordingly, in certain embodiments the GaAs device is subjected to a temperature of approximately 100° C. Once the GaAs has been subjected to heat treatment, the metallization (block 17) of via 113 is complete. In some embodiments, the metallization (block 17) of via 113 is complete without heat treatment.

Referring to the process 10 of FIG. 3, the GaAs wafer having a copper contact layer 106 formed on its back side 105 can undergo a street formation process (block 18). Such a street is described herein as being formed from the back side of the wafer and extending through the copper contact layer 106 to facilitate subsequent singulation of dies. It will be understood that one or more features described herein can also be implemented for other street-like features on or near the back surface of the wafer. Moreover, other street-like features can be formed for purposes other than to facilitate the singulation process.

The street can be formed as described above with respect to FIG. 1 and FIGS. 2M-2O. An etch resist layer defining a street opening can be formed using standard photolithography. Next, the exposed street opening in the copper contact layer 106 may be etched using wet etching, although other etching processes are also possible. A pre-etching cleaning process (e.g., $O_2$ plasma ash) can be performed prior to the etching process. In various implementations, the thickness of the resist and how such a resist is applied to the back side of the wafer can be important considerations to prevent certain undesirable effects, such as via rings and undesired etching of via rim during the etch process.

After etching the street into copper contact layer 106, the resist layer may be removed, using photoresist strip solvents such as NMP (N-methyl-2-pyrrolidone), applied using, for example, a batch spray tool. To remove residue of the resist material that may remain after the solvent strip process, a plasma ash (e.g., $O_2$) and/or aqueous wash process can be applied to the back side of the wafer.

Following street formation (block 18), a protective layer 108 may be deposited over the back side of the GaAs wafer (block 18*a*). Since copper is highly reactive with oxygen, a protective layer 108 is deposited over the copper contact layer 106. In one example, the protective layer 108 is an organic solder preservative (OSP). The OSP may be applied using a bath process, or other known processes may be used. The OSP may be deposited at a thickness of about 700 angstroms. It will be appreciated that other thicknesses may be used depending upon application specific requirements and the particular materials used. For example, thicknesses in the range of about 100 angstroms to about 900 angstroms have been found to be effective, although other thicknesses may be alternatively used.

Figure 4D:
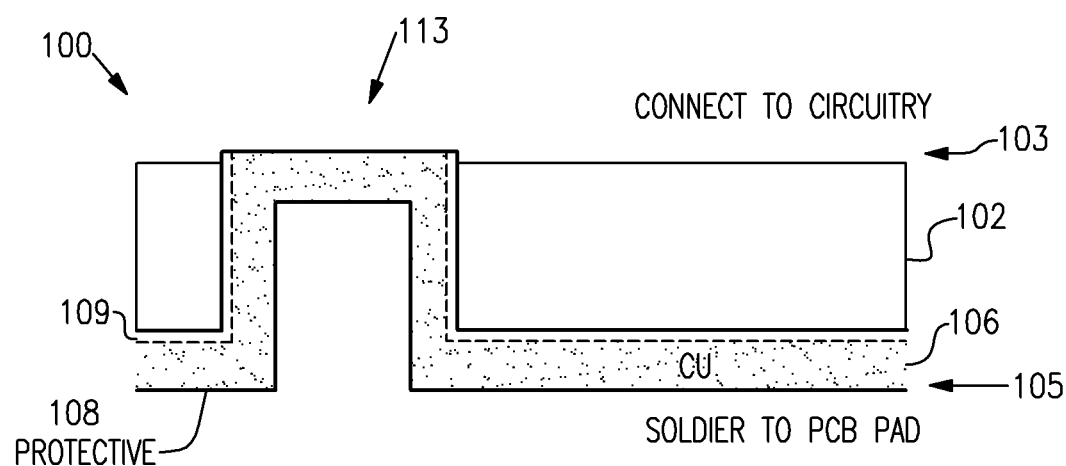

As described in more detail above, street formation (block 18) may be followed by debonding the wafer from the carrier (block 19), and testing the wafer following debonding (block 20). The resulting structure is shown in FIG. 4D.

Stress Balancing

Mechanical stress on the wafers induced during backside wafer metallization and grinding processes such as those described above can result in wafer and die cracks. Also, changed in the wafer front side processing, for example adding materials or altering stress of the materials used, will introduce stress onto the wafer as well. Metallization of copper or other high tensile stress metals such as nickel (Ni) tends to induce even higher stress on the wafers. As a result, the wafer may be warped after debonding, making subsequent processing difficult. Additionally, during later processing as described in greater detail below, the wafer is tape-mounted, which involves flattening the wafer onto a chuck. If warpage is present in the wafer at this stage, wafer and die cracks can result. Thinned GaAs wafers do not have strong mechanical properties, yet with thinner wafers generally desirable due to improved heat transfer characteristics. As such, wafer cracking caused by mechanical stress presents a pressing issue for GaAs wafer processing.

While stress relief etch may release some of the mechanical stress incurred, it is not adequate for relieving stress induced by metallization. Similarly, optimization of the metallization process, such as using low current density during plating, annealing after plating, using different plating chemistry or pre-clean process, or reducing the thickness of the metal on the backside, are also found to be inadequate to reduce stress on the wafers. The inventors have developed a novel stress balancing technique in which one or more stress compensating layers are applied to the wafer to counterbalance the contribution of stress from each metal layer. The technique generally involves measuring and calculating the contribution of stress from each individual metal layer and their cumulative effect on wafer warpage, and then selecting a material with appropriate stress counterbalancing properties to be applied to the wafer.

Figure 5A:
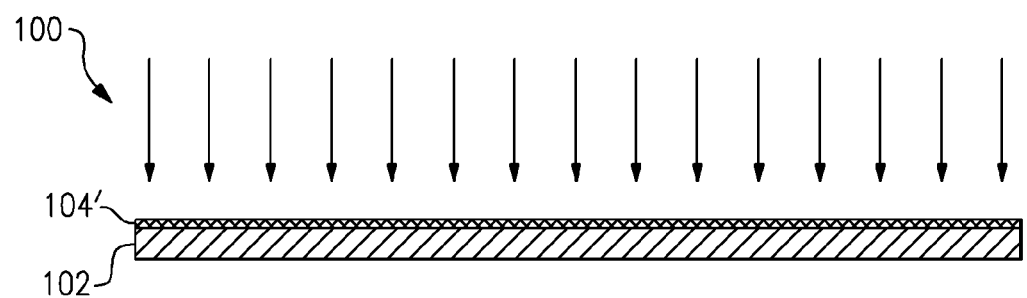
FIGS. 5A-5C show examples of a GaAs wafer assembly at various stages of processing.
Figure 5B:
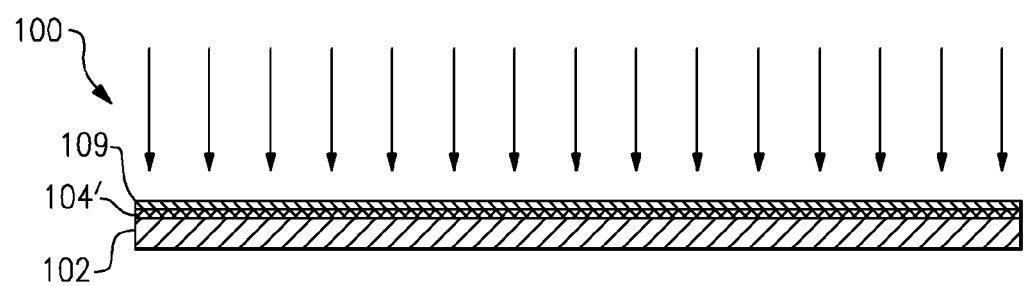
Figure 5C:
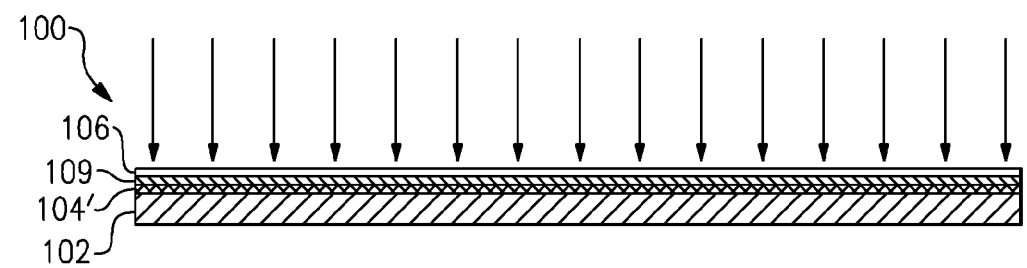

FIGS. 5A-5C, 6, and 7 illustrate an example of the formation of a stress-balanced GaAs wafer using certain preferred embodiments of the stress balancing technique developed by the inventors. FIGS. 5A-5C show a GaAs wafer assembly section 100 in various stages of processing. Referring now to FIG. 6 in conjunction with FIG. 5A-5C, a process 70 is illustrated by which the mechanical stress in the GaAs wafer assembly 100 can be balanced. First, a desired final thickness of a GaAs substrate 102 is selected (block 71). As discussed above, grinding can be used to achieve a desired thickness of the GaAs substrate 102. As illustrated in FIG. 5A, the GaAs substrate 102 has been ground to a desired thickness. For example, a GaAs wafer, prior to grinding, may be approximately 675 μm thick. In some embodiments, the GaAs wafer is ground to an approximately 100 μm thickness.

Next, the tensile stress resulting from deposition of a copper contact layer 106 onto the GaAs substrate 102 is determined (block 72). The thickness of the copper contact layer 106 is pre-selected prior to processing. In some embodiments, instead of using copper, other metals may alternatively be used to form a conductive layer. For example, a conductive layer can be formed from nickel, palladium, or gold. Using the pre-selected thickness and composition of the conductive layer, the tensile stress it will contribute to the wafer assembly can be determined.

The process 70 continues with the step of determining the negative stress needed to compensate for the tensile stress of the conductive layer (block 73). For example, if the deposition of copper contact layer 106 is calculated to produce a tensile stress of 400 MPa, then a compressive stress of approximately—400 MPa can be used to counterbalance the tensile stress of the copper contact layer 106. As shown in FIG. 5A, a compensating layer 104' disposed over the surface of the GaAs substrate 102 is used to counterbalance the tensile stress of the copper contact layer. In some embodiments, the compensating layer 104' can be a barrier layer. As described above, the barrier layer can be a nickel vanadium (NiV) layer disposed at about 800 angstroms thickness. The NiV provides an effective diffusion barrier between the GaAs substrate and the copper contact layer 106, which will be applied later. Since copper is known to have an undesirable diffusion effect on GaAs, the NiV is often deposited in a relatively thick layer.

In some embodiments, the compensating layer 104' is a metal layer. The metal layer can be formed from, for example, copper, nickel, or palladium. In certain embodiments, the compensating layer 104' can be a conductive layer. The conductive layer can likewise be formed from, for example, copper, nickel, or palladium. The thickness of the compensating layer 104' can be controlled using physical vapor deposition (sputtering), chemical vapor deposition, or other suitable process.

FIG. 5B shows section 100 of the GaAs wafer assembly in which a seed layer 109 is deposited over the compensating layer 104'. It has been found that a seed layer facilitates better mechanical and electrical connection of the copper contact layer to be added at a later step. The metal seed layer may be, for example, a copper layer, a gold layer, or a palladium layer. The seed layer 109 can be formed using a physical vapor deposition process or a chemical vapor deposition process, to a thickness of about 0.1 μm.

In FIG. 5C, a copper contact layer 106 is formed over the seed layer 109. As noted above, the copper contact layer 106 serves as the electrical contact layer, and can be formed using an electrochemical plating process. The copper contact layer 106 can be deposited at a relatively uniform thickness, such as about 4 μm. It will be appreciated that other materials may be used for the contact layer, for example nickel, palladium, or gold.

Following the deposition of the copper contact layer 106, processing of the wafer assembly may continue as outlined above with respect to FIGS. 1-4D.

Referring to FIG. 7 in conjunction with FIGS. 5A-5C, a process 80 is illustrated in which a stress-balanced GaAs wafer is formed, according to another embodiment. First, the GaAs substrate 102 is ground from an initial thickness to a desired thickness (81). As noted above, the GaAs substrate 102 can be ground to a thickness of approximately 100 μm. In other embodiments, GaAs substrates 102 of various thicknesses can be used.

The process 80 continues with depositing a stress compensating layer 104' onto the substrate 102 (block 82). The composition and thickness of the compensating layer 104' can be selected in accordance with the process described with respect to FIG. 6. Accordingly, the compensating layer '104 may have a compressive stress that substantially offsets the tensile stress to be contributed by other layers on the GaAs wafer. This may include layers deposited prior to deposition of the compensating layer 104', and/or layers deposited after compensating layer 104' has been deposited. In various embodiments, the compensating layer 104' can be a conductive layer, for example a metal layer. In some embodiments, the metal layer can be formed of nickel, palladium, or other metal. As described above with respect to FIG. 5B, the compensating layer 104' can be a barrier layer that inhibits migration of contaminants from the conductive layer (for example the copper contact layer 106) to the substrate 102.

Next, a conductive layer having a tensile stress is deposited over the compensating layer 104' (block 83). The conductive layer can be a copper contact layer 106 as illustrated in FIG. 5C. In other embodiments, the conductive layer can be a metal layer. In some embodiments, the conductive layer can be a metal layer formed of nickel or palladium. As described above, the tensile stress caused by the conductive layer can be offset by the compressive stress of the stress compensating layer 104'. As noted with respect to FIG. 6, in some embodiments the tensile stress resulting from the conductive layer can be determined prior to processing. Likewise, the compressive stress resulting from the stress compensating layer 104' can be determined prior to deposition.

In some embodiments, the stress compensating layer 104' serves also as the barrier layer. As illustrated in FIGS. 5A-5C, the seed layer is then deposited over the compensating layer 104', followed by the copper contact layer 106. By using the methods outlined in FIGS. 6 and 7, the GaAs wafer assembly can be free from net stress, as the compressive stress of the compensating layer 104' can substantially offset the tensile stress provided by the copper contact layer 106. Accordingly, as the wafer continues throughout further processing, the likelihood of warpage, cracks, or breakage is reduced. As noted above, the wafer is particularly susceptible to warpage and physical damage after debonding. By including stress compensating layer 104' in the wafer assembly, the deleterious effects of wafer warpage, cracks, and breakage may be reduced.

Integrated Circuit Singulation and Packaging

Figure 8A:
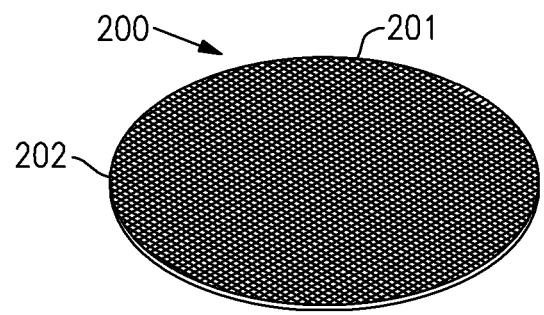
FIGS. 8A-8D show an example sequence of singulating a GaAs integrated circuit die from a wafer.
Figure 8B:
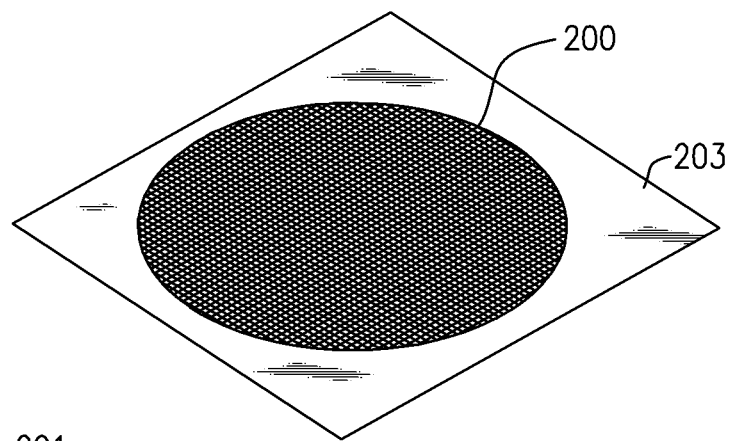

FIG. 8A illustrates a stress-balanced GaAs wafer 200 with a plurality of individual integrated circuits 201 formed in accordance with embodiments of the invention in which copper is used as a contact metal for the vias and back-side plane. As shown in FIG. 8A, streets 202 have been formed in the regions between each integrated circuit 201 on the wafer 200. As described above, street formation involves removing copper in the regions between the integrated circuits.

Figure 8D:
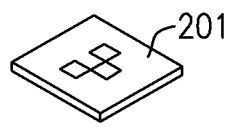
Figure 8C:
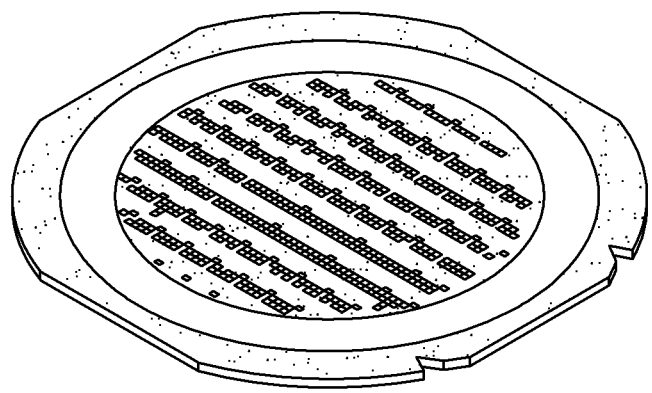

Following street formation, the wafer 200 is placed onto cutting tape 203, with the backside of the GaAs wafer 200 adhering to the cutting tape 203 and frame in the manner shown in FIGS. 8C and 8C. Next, the integrated circuit dies are singulated by cutting through the GaAs wafer along the pre-formed streets. A scribe may be applied to the streets in order to mechanically singulate the integrated circuit dies. Alternatively, a laser may be used to burn through the streets. Mechanical scribing is inexpensive, but typically less accurate than laser singulation, and may cause damage to the die. Laser singulation is more accurate and reduces damage, but at increased expense.

Once the integrated circuit dies have been singulated, the cutting tape is stretched apart. This stretching ensures that the dies have been singulated, as it results in widening the separation between each of the dies. The cutting tape may be stretched until the tape is visible between each of the dies. FIG. 8C illustrates stretched cutting tape in which some of the singulated dies have been removed. The dies may be removed from the cutting tape manually or by automated robotics. For example, an automated die-picking machine may select and remove individual dies through the use of vacuum pressure. FIG. 8D illustrates a singulated GaAs integrated circuit die, according to an embodiment of the present invention.

Once individual GaAs integrated circuit dies have been formed, they may be packaged for incorporation into larger electronic devices. Various types of packaging exist, some of which are described in more detail below. It will be understood that there exist myriad different types of packaging beyond those listed and described herein. Depending on the desired application, virtually any type of packaging may be used in accordance with the present invention. Four different packages are described in more detail below: ball grid array (BGA), land grid array (LGA), molded leadframe, and quad-flat no-leads (QFN).

Figure 9:
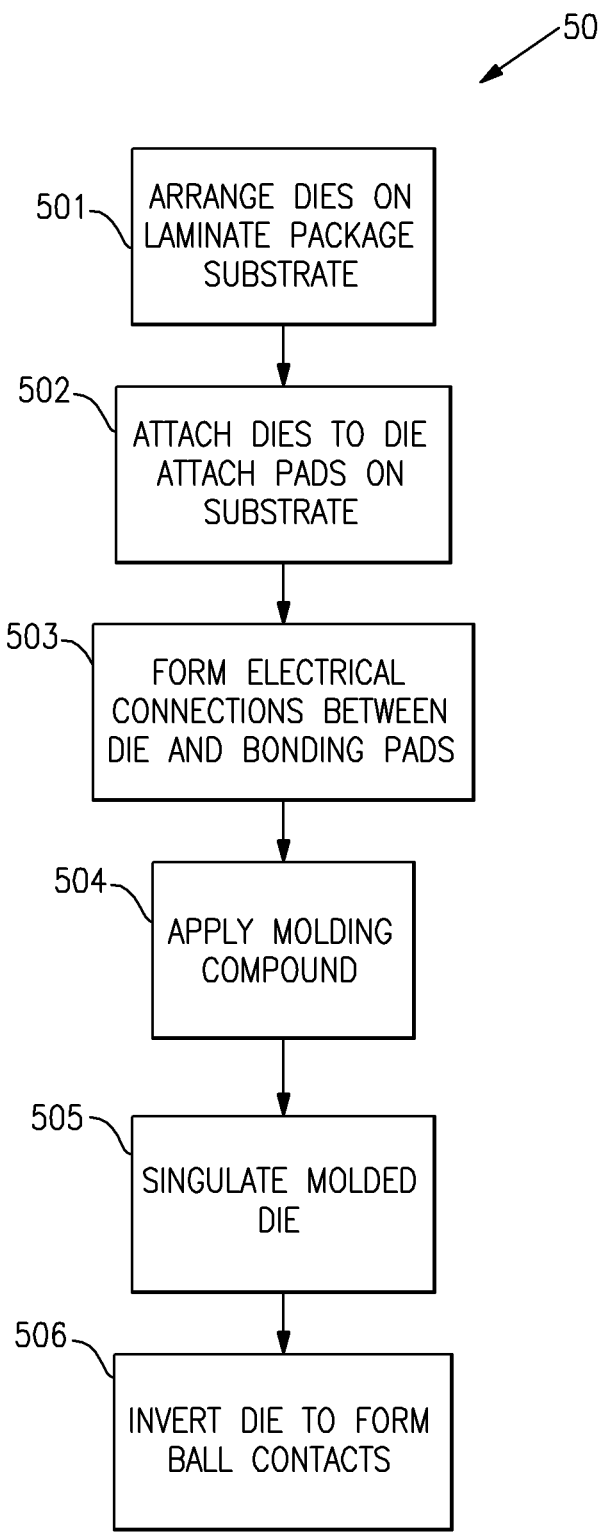
FIG. 9 shows an example sequence of ball grid array packaging of singulated GaAs integrated circuit dies, according to one embodiment.
Figure 10A:
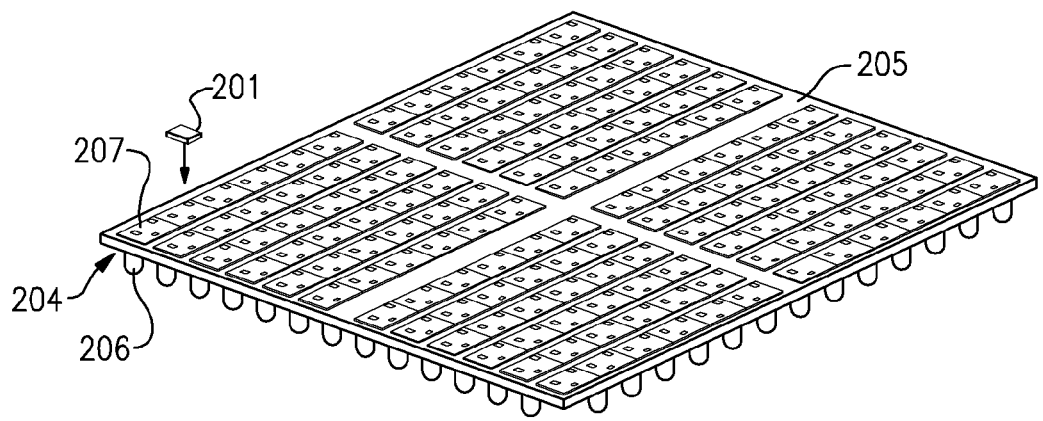
FIGS. 10A-10H show examples of structures at various stages of the processing sequence of FIG. 9.

FIG. 9 shows an example shows an example sequence of BGA packaging of singulated GaAs integrated circuit dies, according to one embodiment, with FIGS. 10A-10H showing examples of structures at various stages of the processing sequence of FIG. 9. With reference to FIG. 10A, individual dies 201 are arranged (block 501), typically in an array, onto a laminate packaging substrate 205. A single packaging substrate 205 such as that shown in FIG. 10A can include between 200 to 400 dies 201, although the specific number may vary depending on the application. The packaging substrate 205 includes pre-formed lower contact pads 204 on its lower surface. As described in more detail below, a grid of solder balls 206 are formed on the lower contact pads 204. On the top surface the packaging substrate has die attach pads 207, onto which singulated dies 201 are mounted, and a plurality upper contact pads 208. The packaging substrate includes internal interconnections to electrically connect the upper contact pads 208 on the top surface to the lower contact pads 204 on the bottom surface.

Figure 10B:
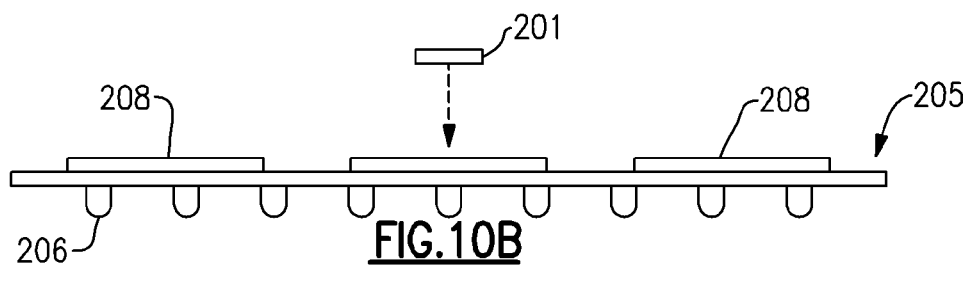
Figure 10C:
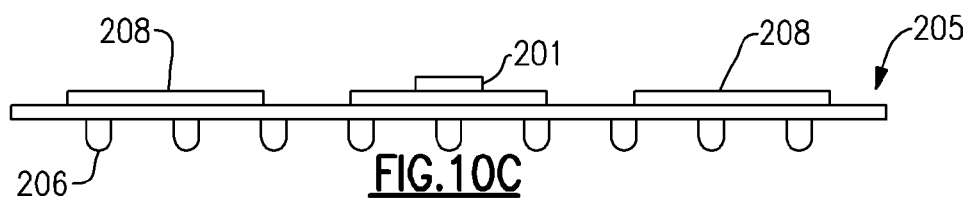

The die attach pad 207 is typically flat and made of tin-lead, silver, or gold-plated copper. With reference to FIGS. 10B and 10C, the individual dies 201 are attached to the die attach pads 207 (block 502) by applying solder paste to all die attach pads 207. Solder paste is an adhesive mixture of flux and tiny solder particles. The solder paste may be deposited by the use of a screen printing process, or by jet-printing. After the solder paste has been applied, individual dies are placed onto the packaging substrate 205 by robotic pick-and-place machines. Individual dies 201 may be removed from the cutting tape and transferred directly to the packaging substrate, where they are positioned to align the die attach pads with the contacts of the individual dies. The solder paste connects the die attach pads 207 to the contacts of the individual dies 201. To provide a more robust connection, the dies are subjected to heat treatment for solder reflow. The precise temperatures and times for this process will vary depending on the composition of the solder paste. Typical temperatures range from 100° to 260° C., with dwell times at peak temperatures ranging from 50 seconds to two minutes. This heat treatment causes the solder particles within the solder paste to melt. The solder is then allowed to cool, resulting in a robust electrical and mechanical connection between the packaging substrate and the individual dies.

Figure 10D:
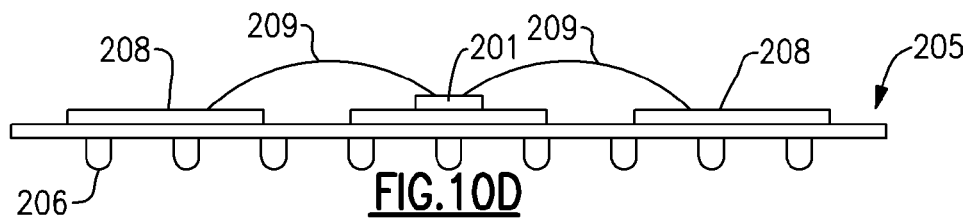

With reference to FIG. 10D, following attachment of the individual dies 201 to the packaging substrate 205, electrical interconnection is formed between bonding pads on the integrated circuit and the upper contact pads 208 on the top surface of the packaging substrate 205 (block 503). This connection may be formed by wire bonding or flip-chip methods. Wire bonding involves arranging wires 209, often made of copper, gold, or aluminum, between an upper contact pad 208 at one end, and a bonding pad on the integrated circuit die 201 at the other. The wire 209 is attached using some combination of heat, pressure, and ultrasonic energy to weld the wire 209 in place. Flip chip interconnection involves applying solder bumps to the bonding pads on the top surface of the integrated circuit. The integrated circuit is then inverted, and arranged such that the solder bumps align with contact pads. With the application of heat, the solder bumps melt and, following a cooling process, an electrical and mechanical connection may be formed between the bonding pads on the integrated circuit die and the contact pads on the packaging substrate.

Figure 10E:
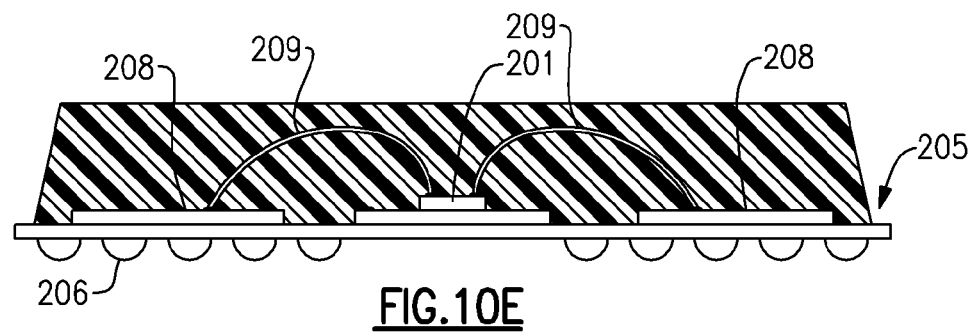
Figure 10F:
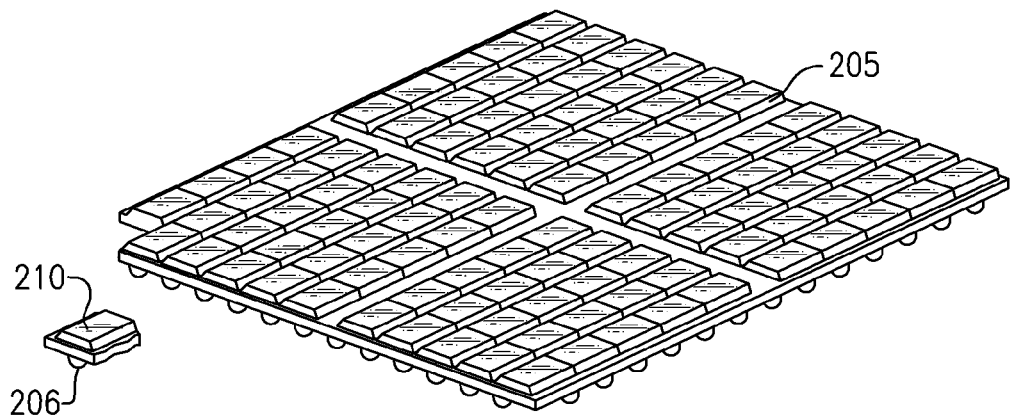

With reference to FIG. 10E, after electrical interconnection has been formed between the die and the packaging substrate, the entire packaging substrate is covered with a molding compound 210 (block 504). There are a wide variety of commercially available molding compounds. Typically, these are epoxy-based compounds. The packaging substrate 205 covered with the molding compound 210 is then cured in an oven. The temperature and duration of curing depends on the particular molding compound selected. As shown in FIG. 10F, after the molding compound 210 has cured, the each die 201 on the packaging substrate 210 is totally encapsulated, including the electrical interconnections 209, with only the bottom surface of the packaging substrate 205, with its lower contact pads, exposed. At this stage, the packaging substrate 205 covered with cured molding compound 210 can be sawed (block 505), thereby singulating the packaged devices. Singulation may be performed mechanically, such as with a wafer saw.

Figure 10G:
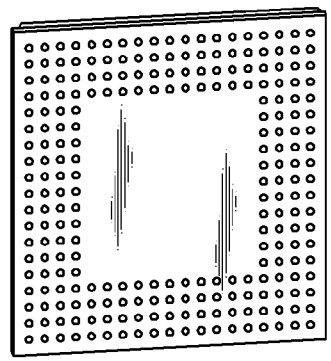
Figure 10H:
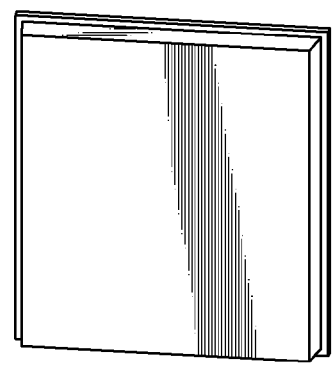

Each packaged device is inverted at this stage, and then on top of each lower contact pad 204 on the packaging substrate, a small ball of solder paste is deposited, creating a grid of solder paste balls 206 (block 506). The BGA package may then be placed over solder pads on a PCB, with each solder paste ball 206 aligned to a solder pad. The solder pads are flat, and typically made of tin-lead, silver, or gold-plated copper. FIG. 10E illustrates a schematic cross-section of a singulated BGA packaged die, with FIGS. 10G and 10H illustrating the top and bottom perspective views of the same.

Figure 11:
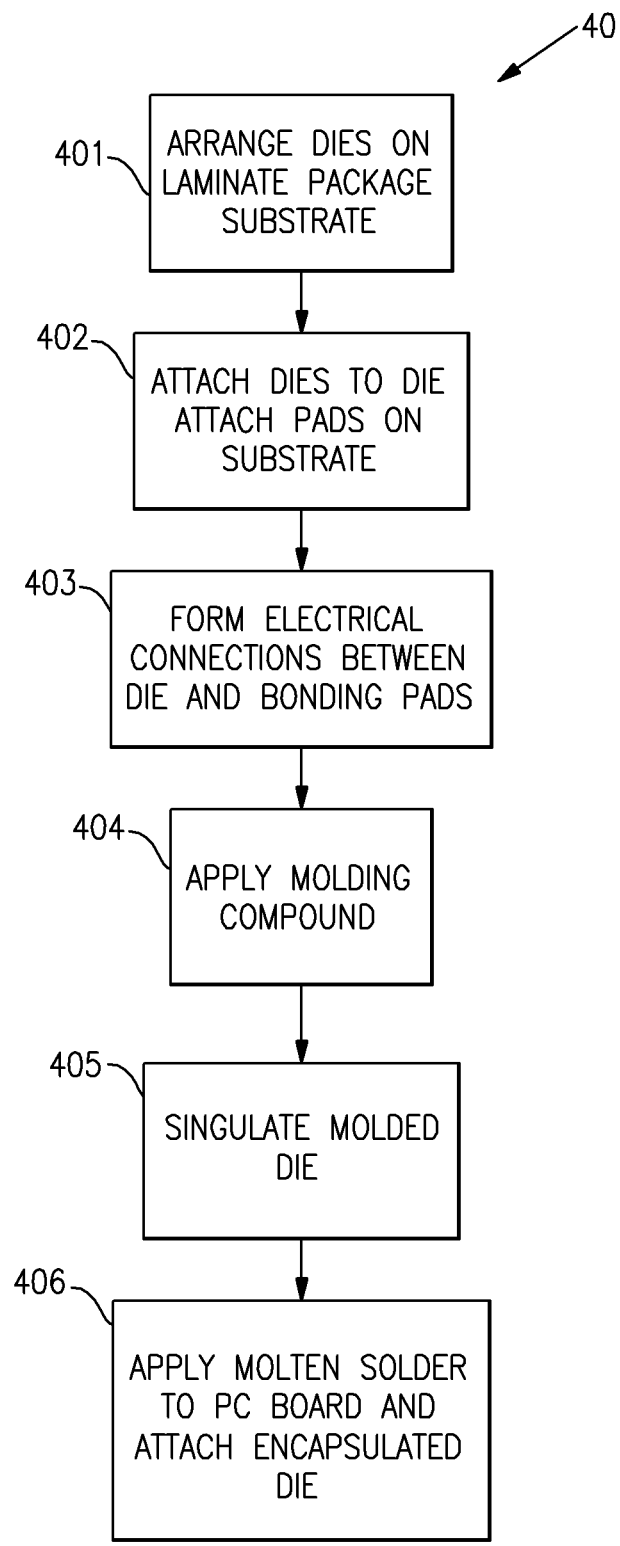
FIG. 11 shows an example shows an example sequence of land grid array packaging of singulated GaAs integrated circuit dies, according to one embodiment.
Figure 12A:
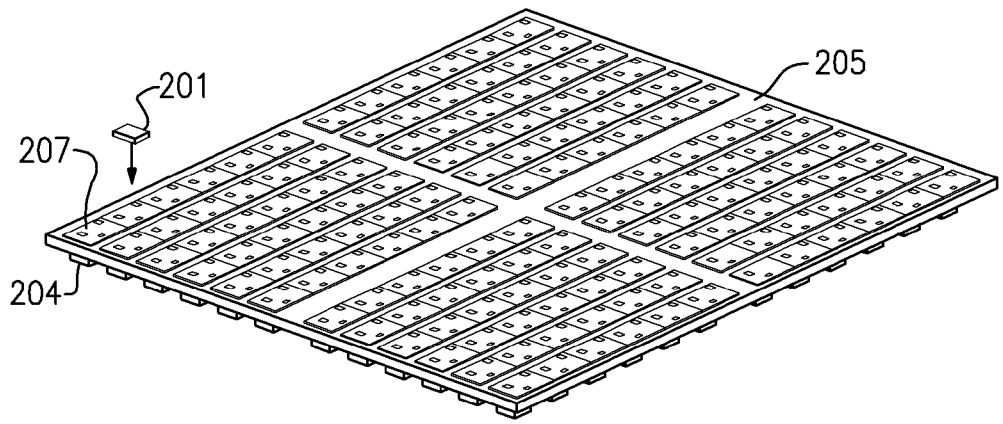
FIGS. 12A-12G show examples of structures at various stages of the processing sequence of FIG. 11.

FIG. 11 shows an example shows an example sequence of LGA packaging of singulated GaAs integrated circuit dies, with FIGS. 12A-12G showing examples of structures at various stages of the processing sequence of FIG. 11. In many respects, LGA packaging is similar to BGA packaging. As shown in FIG. 12A, individual dies 201 are arranged (block 401), typically in an array, onto a laminate packaging substrate 205. The packaging substrate 205 includes pre-formed lower contact pads 204 on its lower surface. On the top surface the packaging substrate has die attach pads 207, onto which singulated dies 201 are mounted, and a plurality upper contact pads 208. The packaging substrate includes internal interconnections to electrically connect the upper contact pads 208 on the top surface to the lower contact pads 204 on the bottom surface.

Figure 12B:
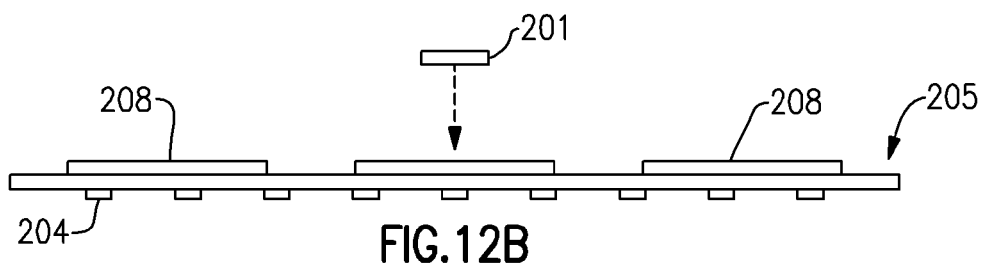
Figure 12C:
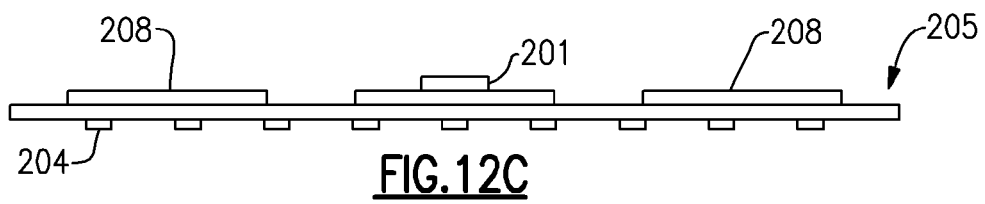

The die attach pad 207 is typically flat and made of tin-lead, silver, or gold-plated copper. With reference to FIGS. 12B and 12C, the individual dies 201 are attached to the die attach pads 207 (block 402) by applying solder paste to all die attach pads 207, similar to BGA packaging. After the solder paste has been applied, individual dies are placed onto the packaging substrate 205 by robotic pick-and-place machines. The solder paste connects the die attach pads 207 to the contacts of the individual dies 201. To provide a more robust connection, the dies are subjected to heat treatment for solder reflow, as described in more detail above.

Figure 12D:
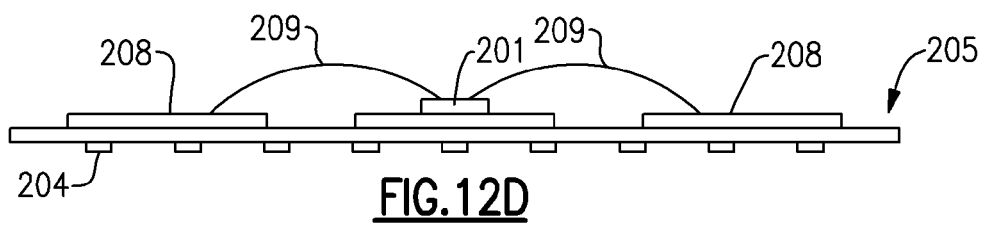

With reference to FIG. 12D, following attachment of the individual dies 201 to the packaging substrate 205, electrical interconnection is formed between bonding pads on the integrated circuit and the upper contact pads 208 on the top surface of the packaging substrate 205 (block 403). This connection may be formed by wire bonding or flip-chip methods, as described with respect to BGA packaging above.

Figure 12E:
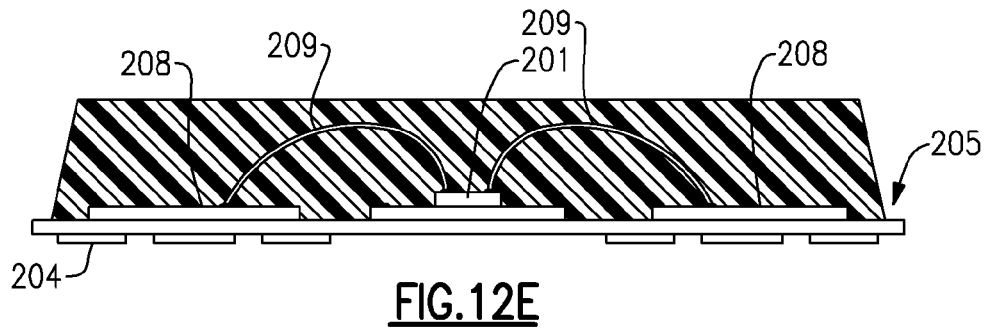
Figure 12F:
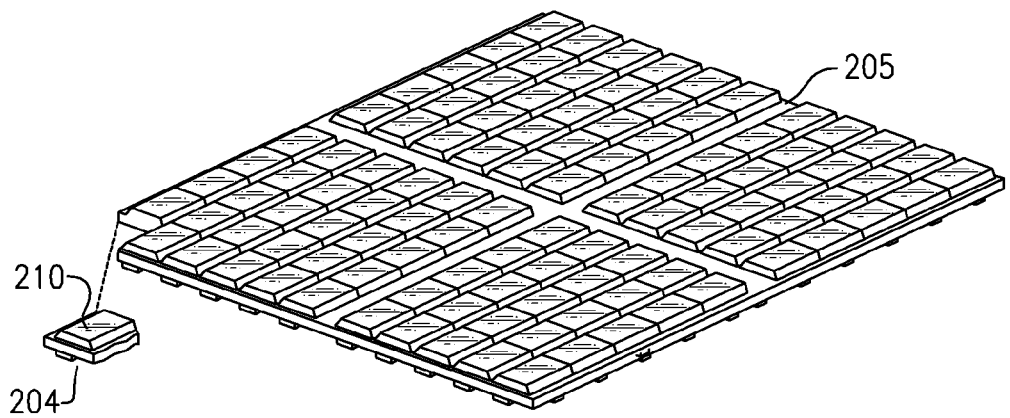

With reference to FIG. 12E, after electrical interconnection has been formed between the die and the packaging substrate, the entire packaging substrate is covered with a molding compound 210 (block 404). The packaging substrate 205 covered with the molding compound 210 is then cured in an oven. As shown in FIG. 12F, after the molding compound 210 has cured, the each die 201 on the packaging substrate 210 is totally encapsulated, including the electrical interconnections 209, with only the bottom surface of the packaging substrate 205, with its lower contact pads, exposed. At this stage, the packaging substrate 205 covered with cured molding compound 210 can be sawed (block 405), thereby singulating the packaged devices.

Figure 12G:
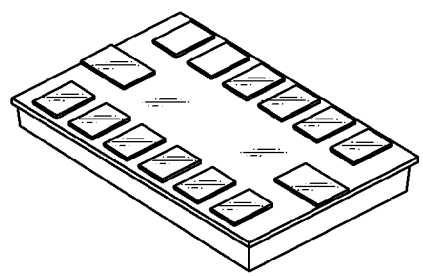

It is at this stage that LGA packaging deviates from BGA packaging described above. In contrast to BGA, LGA does not involve placing small balls of solder paste onto the packaging substrate. Rather, the solder paste, or alternatively molten solder, is placed onto the PCB over the solder pads, and then the LGA packaged device is arranged such that the contact pads 204 are aligned over the solder pads (block 406). For mounting onto a PCB, the package may be placed over corresponding solder pads on the PCB, followed by heat treatment to induce solder reflow. The PCB is outfitted with pre-formed conductive solder pads, also known as PCB pads, arranged to correspond to contact pads 204 of the packaging substrate. In short, BGA involves applying solder paste to the packaging substrate 205, whereas LGA involves applying solder paste to the PCB. FIG. 12E illustrates a schematic cross-section of a singulated BGA packaged die, with FIG. 12G illustrating a bottom perspective view of the same After placement of the packaged device on the packaging substrate, BGA and LGA proceed similarly. The packaged device mounted onto a PCB is subjected to a heat treatment for solder reflow, followed by a cool down period.

Figure 13:
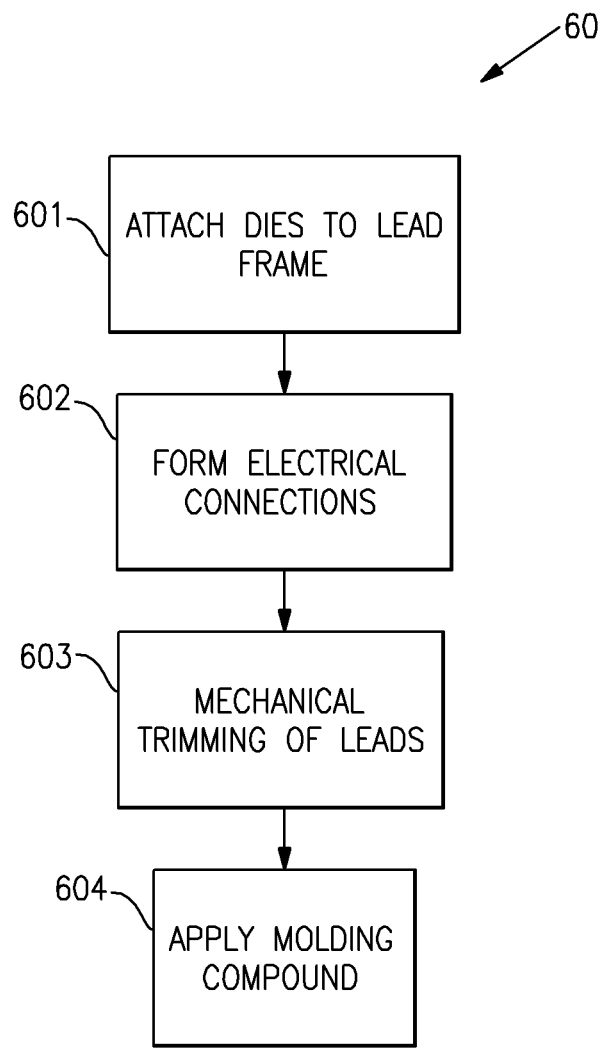
FIG. 13 shows an example shows an example sequence of leadframe packaging of singulated GaAs integrated circuit dies, according to one embodiment.
Figure 14A:
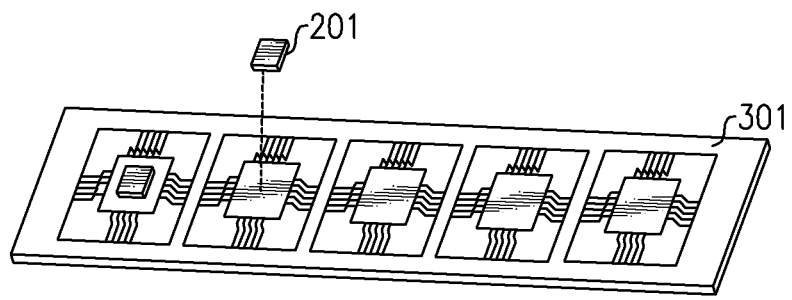
FIGS. 14A-14D show examples of structures at various stages of the processing sequence of FIG. 13, according to one embodiment.

FIG. 13 shows an example shows an example sequence of leadframe packaging of singulated GaAs integrated circuit dies, with FIGS. 14A-14D showing examples of structures at various stages of the processing sequence of FIG. 13. With reference to FIG. 14A, individual singulated integrated circuit dies 201 are mounted onto a metallic leadframe 301 (block 601). The leadframe 301 includes a plurality of die attach regions 302, and a plurality of leads 303. The leadframe 301 is typically made of a thin sheet of copper or copper alloy. In some instances, the copper is plated with another metal, such as pure tin, silver, nickel, gold, or palladium. For high-throughput, the processing may be performed in batches, in which an array or strip of connected leadframes is provided.

The singulated dies 201 can be mounted onto the die attach regions 302 of the leadframe 301 by an adhesive or soldering process (block 601). The bond is typically formed between the backside metallization of the die and the metal surface of the leadframe. The bond can be formed using solder paste followed by a reflow process, as described above. Alternatively, molten solder can be placed directly onto the die attach pad, followed by placement of the die. Conductive epoxy adhesives may also be used in place of solder.

Figure 14B:
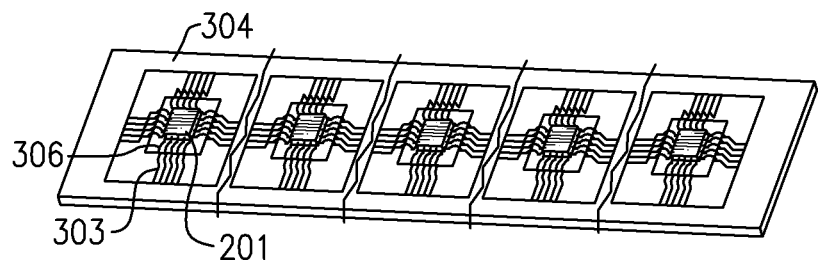
Figure 14C:
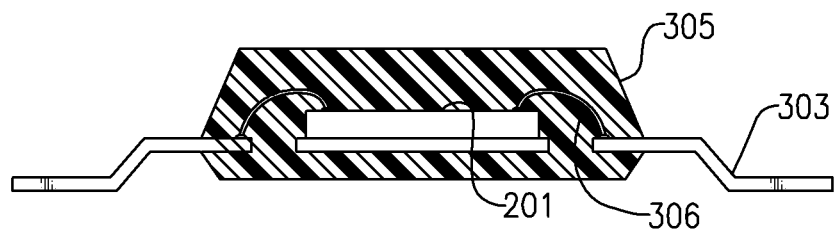
Figure 14D:
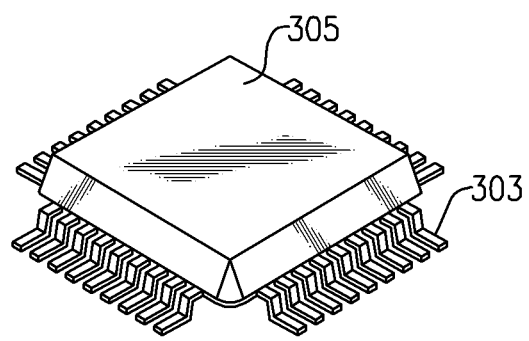

With reference to FIG. 14B, After the die has been attached to the leadframe, wire bonding is then used to form electrical connections 306 between the die attach pads to the package leads (block 602). Next, a mechanical trimming operation separates the leads 303 from the die bonding platform on the lead frame 301 (block 603). Plastic or other molding compound 305 is then injection molded around the die 201 and leadframe 301 to form the typical black plastic body (block 604), similar to the molding processes described above with respect to LGA and BGA packaging. In typical leadframe packaging, however, the frame for injection molding is designed such that a portion of the leads 303 remains uncovered by the molding compound 305. Following curing, the packaged device is presented with a portion of the leads 303 extending out from the cured molding compound, typically a black plastic. FIG. 14C illustrates a schematic cross-section of a singulated leadframe packaged die, with FIG. 14D illustrating a top perspective view of the same The sequence illustrated in FIG. 13 can also be applied to quad-flat no lead (QFN) packaging of singulated GaAs integrated circuit dies. FIGS. 15A-15E show examples of structures at various stages of the processing sequence. QFN packaging is similar to leadframe packaging, with some important distinctions. With reference to FIG. 15A, QFN packaging also begins with a leadframe 301 comprising die attach regions 302 and a plurality of leads 303. Singulated dies 201 are attached to the leadframe 301 in a manner similar to that described above with respect to standard leadframe packaging (block 701). As shown in FIG. 15B, Wire bonding then follows, as described above, to connect the die 201 to the leadframe leads 303 with wires 306 (block 702). With QFN packaging, however, the leads 303 are not designed to extend out beyond the cured molding materials after singulation. Accordingly, there is no need for singulation prior to injection molding of the molding compound over the leadframe and die. Instead, a batch of connected mounted dies 201 can be covered with a molding compound, followed by a curing process (block 703).

Once the molding compound 305 has cured, the leadframes with mounted dies are singulated (block 704). Typically a diamond saw is used to cut through the hardened cured molding compound 305. As the diamond saw cuts through the leads 303, each side of the QFN package has exposed portions of the leadframe 301. Unlike traditional leadframe packaging, however, the exposed portions are flush with the molding compound 305. The leads 303 are also typically exposed on the lower surface of the QFN package. FIG. 15C illustrates a schematic cross-section of a singulated QFN packaged die, with FIGS. 15D and 15E illustrating top bottom and perspective views of the same.

Mounted Integrated Circuit Device

Figure 16:
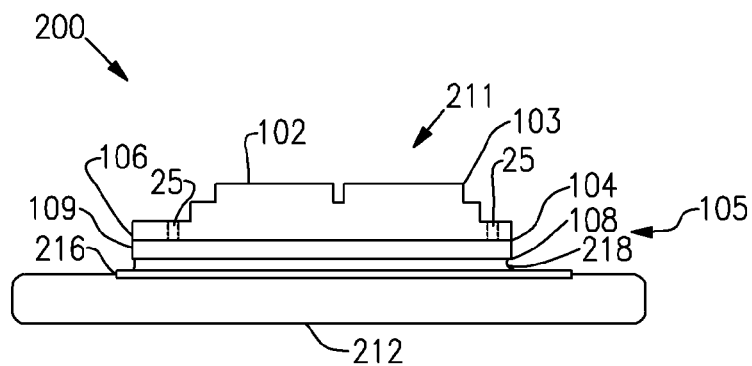
FIG. 16 illustrates a GaAs integrated circuit device made according to various methods of the present invention, mounted onto a printed circuit board.

FIG. 16 illustrates one embodiment of a GaAs integrated circuit device 200. The device 200 generally comprises a printed circuit board 212 connected to a GaAs integrated circuit 211. The GaAs integrated circuit 211 has a backside 105 and a frontside 103. The GaAs integrated circuit 211 includes a GaAs substrate 102, a barrier layer 104, a protective layer 108, and a copper contact layer 106. In some embodiments, the GaAs integrated circuit 211 may also include a seed layer 109 between the copper contact layer 106 and the barrier 104. The seed layer 109 may serve to facilitate mechanical and electrical connection to the copper contact layer 106, but is not always necessary. The printed circuit board includes a pad which is adapted to couple with the GaAs integrated circuit 211 at the backside 105. The GaAs integrated circuit 211 is configured to be mounted on the printed circuit board 212 by the pad 216. In one embodiment, the GaAs integrated circuit 211 is mounted to the pad 216 by a layer of solder 218 interposed between the backside 105 and the pad 216.

The barrier layer 104 is formed on the lower surface 105 of the GaAs substrate 102 and serves to isolate the copper contact layer 106 from the GaAs substrate 102 to prevent copper diffusion. The copper contact layer 106 is formed on the backside 105 of the GaAs integrated circuit 211. The copper contact layer 106 provides an electrical ground contact between the GaAs substrate 102 and the pad 216 on the printed circuit board 212. In one embodiment, the layer of solder 218 is formed between the copper contact layer 106 and the pad 216 to securely mechanically attach the backside 105 of the GaAs integrated circuit 211 to the printed circuit board 212. In one embodiment, the protective layer 108 is formed between the copper contact layer 106 and the solder 218 to prevent oxidation of the copper. The GaAs substrate 102 comprises a plurality of vias 25 which have been etched through the GaAs substrate 102 to form electrical connections between various integrated circuits disposed thereon. The vias 25 have sidewalls which will comprise the layers previously deposited on the GaAs substrate, as described in more detail above.

Figure 17:
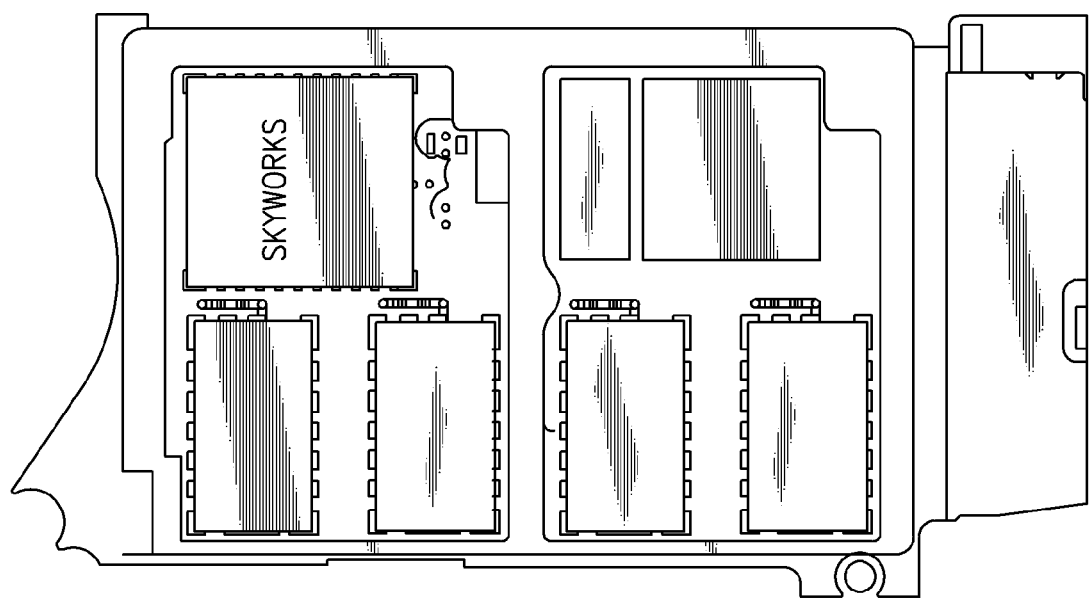
FIG. 17 illustrates an electronic device incorporating a GaAs integrated circuit device made according to various methods of the present invention.

FIG. 17 illustrates a portion of an electronic device incorporating a GaAs integrated circuit device made according to various methods of the present invention. In some embodiments, the device can be a portable wireless device, such as a cellular phone. The device can include a battery configured to supply power to the device, a circuit board configured to provide support for and to interconnect various electronic components, and an antenna configured to receive and transmit wireless signals. The electronic device can include a number of additional components, such as a display processor, central processor, user interface processor, memory, etc. In other embodiments, the electronic device may be a component of a tablet computer, PDA, or other wireless device.

Terminology

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method for stress balancing in a GaAs wafer assembly, said method comprising:
   selecting a GaAs substrate having a desired final thickness;
   determining tensile stress resulting from deposition of a conductive layer of a pre-selected thickness on said GaAs substrate;
   determining negative stress needed to compensate the tensile stress of the conductive layer so that said GaAs wafer assembly remains substantially free of warpage;
   depositing a stress compensating layer having said negative stress over said GaAs substrate; and
   depositing the conductive layer having said tensile strength over said stress-compensating layer.

2. The method of claim 1 wherein the conductive layer is a metal layer.

3. The method of claim 2 wherein the metal layer is formed from copper.

4. The method of claim 2 wherein the metal layer is formed from nickel.

5. The method of claim 2 wherein the metal layer is formed from palladium.

6. The method of claim 1 wherein said stress compensating layer includes sufficient compressive stress relative to said GaAs substrate so as to cancel the tensile stress on said GaAs substrate resulting from deposition of the conductive layer.

7. The method of claim 1 wherein said stress compensating layer is formed from a metal.

8. A semiconductor integrated circuit made in accordance with the method of claim 1.

9. A method of manufacturing a GaAs wafer assembly, said method comprising:

grinding a GaAs substrate from an initial thickness to a final desired thickness;

depositing a stress compensating layer having a compressive stress on the GaAs substrate after said grinding; and depositing a conductive layer on said stress compensating layer, said conductive layer having a tensile stress so that compressive stress associated with said stress compensating layer cancels the tensile stress of the conductive layer thereby resulting in a substantially warp-free wafer assembly.

10. The method of claim 9 wherein the stress compensating layer is conductive.

11. The method of claim 9 wherein the stress compensating layer is a barrier layer that inhibits migration of contaminants from the conductive layer to the substrate.

12. The method of claim 9 wherein the stress compensating layer is a metal layer.

13. The method of claim 12 wherein the metal layer is formed of nickel.

14. The method of claim 12 wherein the metal layer is formed of palladium.

15. The method of claim 9 wherein the conductive layer is a metal layer.

16. The method of claim 15 wherein the metal layer is formed of copper.

17. The method of claim 15 wherein the metal layer is formed of nickel.

18. The method of claim 15 wherein the metal layer is formed of palladium.

19. The method of claim 9 wherein the stress compensating layer is a metal layer configured to induce compressive stress on said GaAs substrate.

20. A semiconductor integrated circuit made in accordance with the method of claim 9.

21. The method of claim 1 wherein said conductive layer is deposited by backside wafer metallization.

22. The method of claim 9 wherein said conductive layer is deposited by backside wafer metallization.

* * * * *